(12) United States Patent
Ookouchi et al.

(10) Patent No.: US 8,026,048 B2
(45) Date of Patent: Sep. 27, 2011

(54) DEVELOPING APPARATUS AND DEVELOPING METHOD

(75) Inventors: Atsushi Ookouchi, Koshi (JP); Taro Yamamoto, Koshi (JP); Hirofumi Takeguchi, Koshi (JP); Hideharu Kyouda, Koshi (JP); Kousuke Yoshihara, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 12/877,612

(22) Filed: Sep. 8, 2010

(65) Prior Publication Data

US 2010/0330508 A1 Dec. 30, 2010

Related U.S. Application Data

(62) Division of application No. 10/584,264, filed as application No. PCT/JP2004/019417 on Dec. 24, 2004, now Pat. No. 7,823,534.

(30) Foreign Application Priority Data

Dec. 26, 2003 (JP) .................. 2003-435897
Aug. 10, 2004 (JP) .................. 2004-233617

(51) Int. Cl.
*G03F 7/00* (2006.01)
*G03F 7/26* (2006.01)
*G03F 7/30* (2006.01)
*B05C 5/02* (2006.01)

(52) U.S. Cl. .......... 430/423; 430/432; 430/434; 118/52; 118/313; 118/320; 118/663

(58) Field of Classification Search .................. 430/423, 430/432, 434; 118/52, 313, 320, 663
See application file for complete search history.

(56) References Cited

U.S. PATENT DOCUMENTS

| | | | |
|---|---|---|---|
| 3,953,265 A | 4/1976 | Hood | |
| 5,499,733 A | 3/1996 | Litvak | |
| 5,962,070 A | 10/1999 | Mitsuhashi et al. | |
| 6,191,053 B1 | 2/2001 | Chun et al. | |
| 6,241,403 B1 | 6/2001 | Sakamoto et al. | |
| 6,247,479 B1 | 6/2001 | Taniyama et al. | |
| 6,371,667 B1 | 4/2002 | Kitano et al. | |
| 6,416,583 B1 | 7/2002 | Kitano et al. | |
| 6,656,277 B2 | 12/2003 | Sanada et al. | |
| 2001/0009452 A1 | 7/2001 | Matsuyama et al. | |
| 2002/0000193 A1 | 1/2002 | Kitano et al. | |

FOREIGN PATENT DOCUMENTS

EP 1 732 108 12/2006

(Continued)

*Primary Examiner* — Amanda C. Walke
(74) *Attorney, Agent, or Firm* — Oblon, Spivak, McClelland, Maier & Neustadt, L.L.P.

(57) ABSTRACT

A developer nozzle is moved from a periphery of a wafer toward the central portion while an exposed substrate held at a spin chuck is being rotated about a vertical axis and while a developing solution is being discharged from the developer nozzle, and this way the developing solution is supplied to the surface of the wafer, the developer nozzle having a slit-like ejection port whose longitudinal direction is oriented to the direction perpendicular to the radial direction of the wafer. The movement speed of the nozzle is higher than a case where a nozzle with a small-diameter circular nozzle is used, and this enables a development time to be reduced. Further, the thickness of a developing solution on a substrate can be reduced, so that the developing solution can be saved.

13 Claims, 15 Drawing Sheets

FOREIGN PATENT DOCUMENTS

| | | |
|---|---|---|
| EP | 1 793 417 | 6/2007 |
| JP | 2 270318 | 11/1990 |
| JP | 3 124017 | 5/1991 |
| JP | 7 263302 | 10/1995 |
| JP | 8 8163 | 1/1996 |
| JP | 8-22128 | 1/1996 |
| JP | 11 111603 | 4/1999 |
| JP | 11 156278 | 6/1999 |
| JP | 11-264756 | 9/1999 |
| JP | 11-329955 | 11/1999 |
| JP | 2000 315643 | 11/2000 |
| JP | 2001 102292 | 4/2001 |
| JP | 2001 274082 | 10/2001 |
| JP | 2001 284206 | 10/2001 |
| JP | 2003 303752 | 10/2003 |
| WO | 98/57757 | 12/1998 |

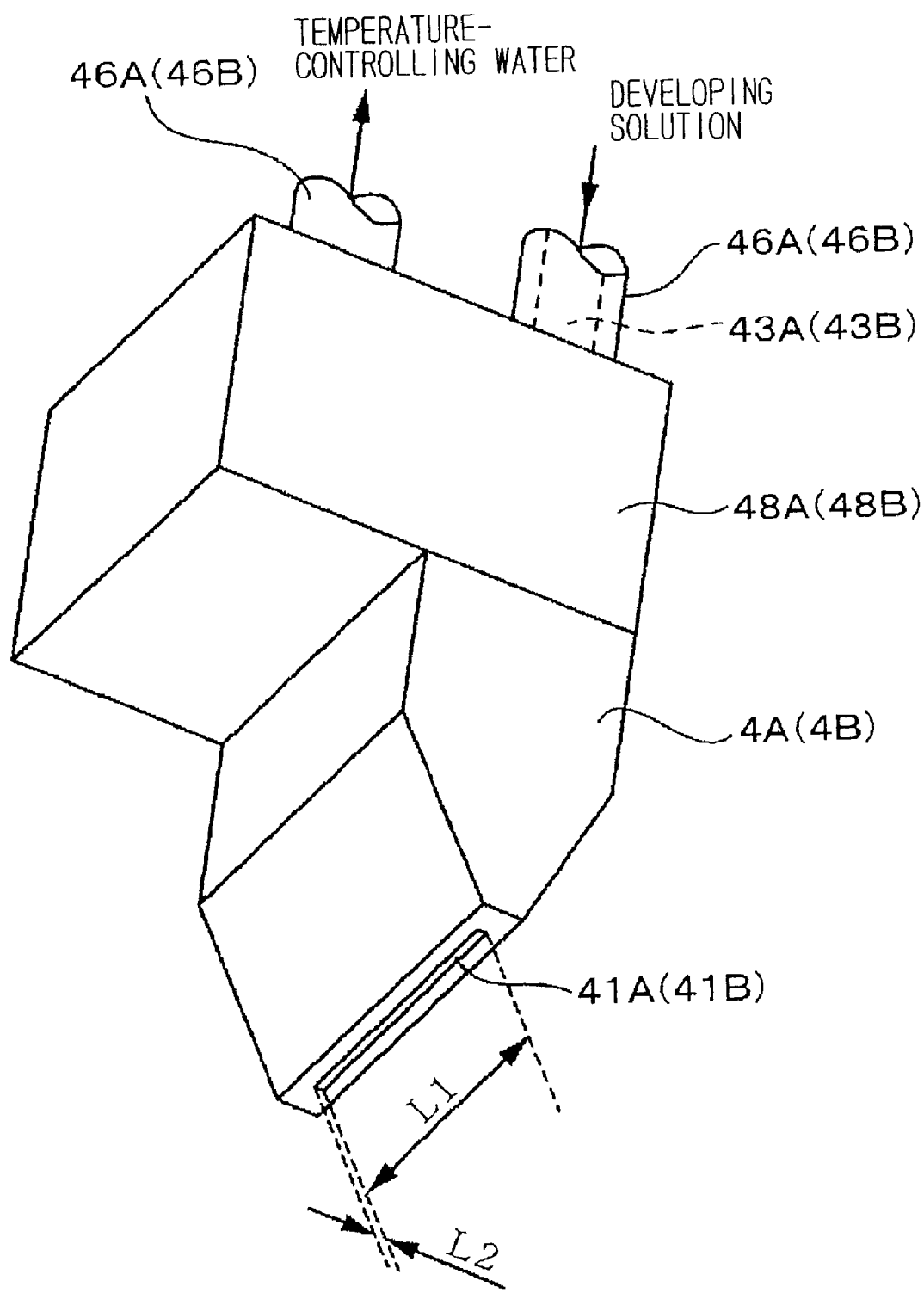
F I G. 3

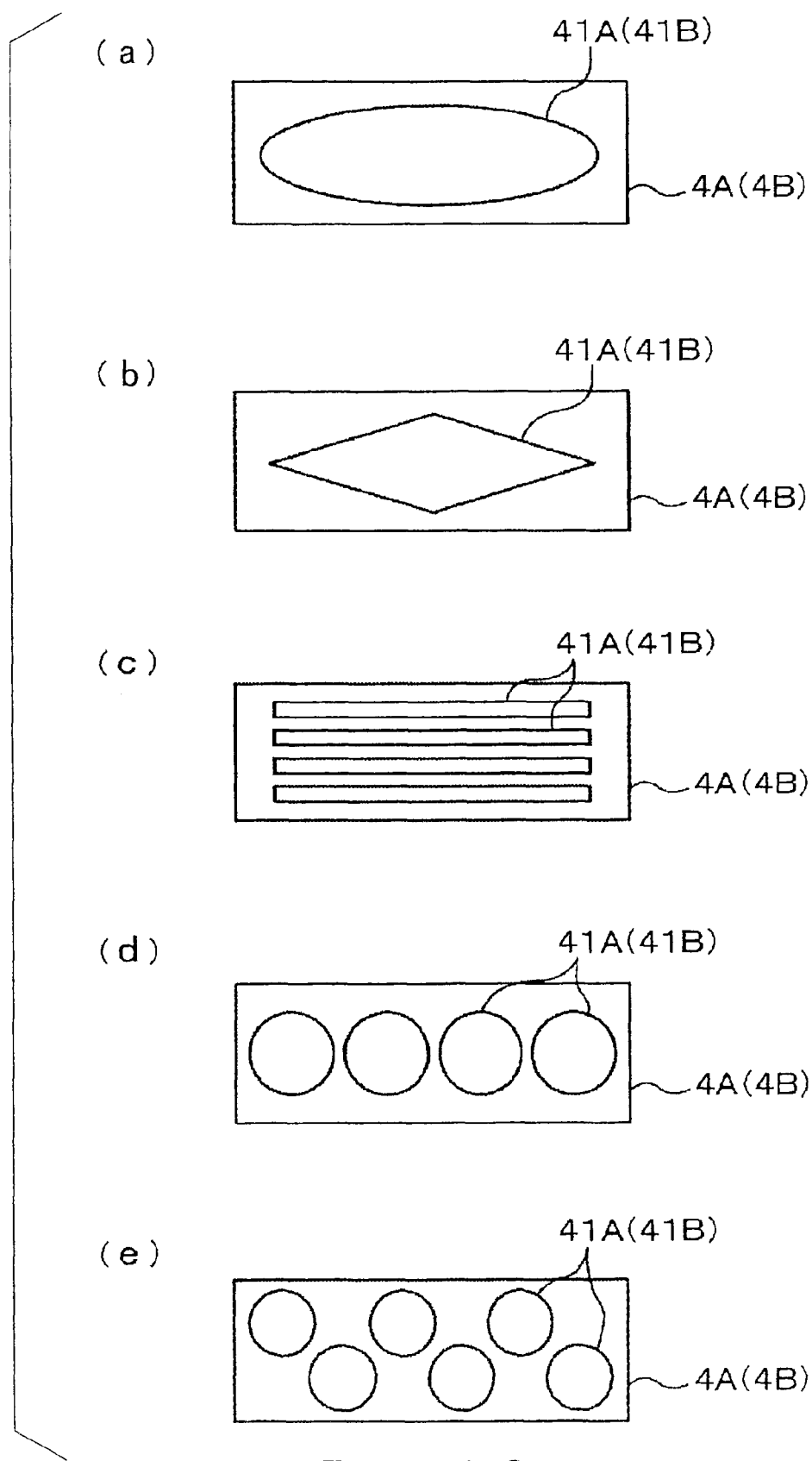
F I G. 1 0

DEVELOPING APPARATUS AND DEVELOPING METHOD

CROSS REFERENCE

This application is a division of and is based upon and claims the benefit of priority under 35 U.S.C. §120 for U.S. Ser. No. 10/584,264, filed Jun. 26, 2006, the entire contents of which are incorporated herein by reference, which is a National Stage of PCT/JP04/19417, filed Dec. 24, 2004, and claims the benefit of priority under 35 U.S.C. §119 from Japanese Patent Application No. 2003-435897, filed Dec. 26, 2003 and Japanese Application No. 2004-233617, filed Aug. 10, 2004.

TECHNICAL FIELD

The present invention relates to a developing apparatus and method for developing an exposed resist on a substrate surface.

BACKGROUND ART

A semiconductor manufacturing process includes a photoresist process in which a resist is coated onto the surface of a semiconductor wafer (hereinafter referred to simply as a wafer), exposed in a predetermined pattern, and then developed to form a resist pattern. Such a process is generally performed by a system in which a coating-and-developing apparatus for coating-and-developing a resist is connected to an exposure apparatus.

The operation of the developing apparatus disclosed in JP7-263302A will be described with reference to FIG. 17. First, a wafer W is held in a horizontal attitude on a spin chuck 1, and a developer nozzle 11 is positioned such that its small diameter ejection port is located slightly higher than the surface of the wafer W. Then, the developer nozzle 11 is moved in a radial direction relative to the rotational axis of the wafer W while ejecting a developing solution through the developer nozzle 11 and while rotating the wafer W around a vertical axis. This causes the developing solution to be accumulated on the surface of the wafer W in a spiral manner, as shown in FIG. 17(a). Then, the wafer W with the developing solution 12 accumulated on its surface is left for a predetermined developing time (e.g., 60 seconds) to cause "stationary development" of the resist, as shown in FIG. 17(b). After that, a rinse liquid 14 (e.g., deionized water) is supplied to the center portion of the wafer W through a rinse liquid nozzle 13, as shown in FIG. 17(c). As a result, the portions of the resist insoluble in the developing solution remain, forming a predetermined resist pattern.

In the developing apparatus disclosed in JP2001-284206A, the developer nozzle 11 and the rinse nozzle 13 are mounted on the same nozzle arm (not shown) such that they are adjacent each other in the traveling direction of these nozzles, as shown in FIG. 18. When developing the resist on the wafer W, the developer nozzle 11 and the rinse nozzle 13 are moved from the periphery of the wafer W toward the center portion while ejecting a developing solution and a rinse liquid simultaneously through these nozzles and while rotating the wafer W on the spin chuck 1 around a vertical axis. Thus, the resist on the wafer W is developed while removing the developing solution right after it is supplied to the surface of the wafer W by using the rinse liquid.

However, the above developing method suffers from the following problem. When the resist on the wafer W is developed by using a puddle method (i.e., stationary development) disclosed in JP7-263302A that develops the resist with a developing solution accumulated on the wafer W surface, a pullback phenomenon occurs if the amount of developing solution accumulated on the wafer W is too small, since the resist is generally hydrophobic. In this pullback phenomenon, small amounts of liquid, or developing solution, collected in different places on the wafer W pull each other due to surface tension, which may prevent contact between some portions of the resist and developing solution and hence prevent development of these portions. To overcome this problem, a large amount of developing solution must be supplied to the surface of the wafer W. However, this consumes a large amount of developing solution, increasing the manufacturing cost of the semiconductor device.

A puddle-less method (without performing stationary development) disclosed in JP2001-284206A is one of solutions for the foregoing problem. However, if the size of the ejection port of the developer nozzle is reduced to reduce the amount of developing solution consumed, it takes a long time to apply a developing solution to the entire surface of the wafer W, resulting in increase of the developing time. Furthermore, different portions of the wafer W may be in contact with the developing solution for different amounts of time, resulting in degradation of in-plane uniformity of the developing process.

Further, the following problem arises when the developing solution is removed immediately after its application by supplying deionized water through the rinse nozzle disposed adjacent the developer nozzle as disclosed in JP2001-284206A. It is not possible to ensure a developing time long enough to develop a resist having a low dissolution rate in the developing solution. As a result, there occurs under-development, which means that the sides of the bottom portion of a groove formed in the resist film are not sufficiently dissolved and remain. This results in variations in line width of the resist pattern.

DISCLOSURE OF THE INVENTION

The present invention has been made in view of the above problems. It is, therefore, an object of the present invention to provide an apparatus and method capable of developing an exposed resist on a substrate surface in a short time with a reduced amount of developing solution.

According to a first aspect of the present invention, there is provided a developing apparatus including: a substrate holding unit that holds a substrate in a horizontal attitude, the substrate having an exposed resist thereon; a rotational drive mechanism that rotates the substrate holding unit, holding the substrate, around a vertical axis; a developer nozzle that ejects a developing solution toward the substrate, the developer nozzle having an ejection port having a shape of an elongated slit; and a moving mechanism that moves the developer nozzle in a substantially radial direction of the substrate, the moving mechanism including a nozzle support unit to support the developer nozzle; wherein the nozzle support unit of the moving mechanism is configured to supports the developer nozzle such that a longitudinal direction of the ejection port is oriented toward a center portion of the substrate when the ejection port is located above the substrate; and wherein said developing apparatus is configured so that the developer nozzle is moved from a peripheral portion of the substrate toward the center portion of the substrate while ejecting the developing solution in a form of a strip through the ejection port and while rotating the substrate around the vertical axis, thereby to supply the developing solution to a surface of the substrate in a spiral form.

Preferably, the ejection port has a width in a range of 0.1 mm to 1 mm and a length in a range of 8 mm to 15 mm. The developing apparatus may further includes a temperature regulating unit for controlling temperature of the developing solution to be supplied from the developer nozzle according to a type of the resist on the substrate or a specific geometrical characteristic of a pattern of the resist. In this case, preferably, there are provided plural number of said developer nozzles, and each of the developer nozzles is provided with a temperature regulating unit to control the temperature of a developing solution; and means for selecting a particular one of the plurality of developer nozzles, wherein the temperature of the selected developer nozzle has been adjusted according to a type of the resist to be developed on the substrate or a specific geometrical characteristic of a pattern of the resist. Further in this case, while said one developer nozzle is selected, the temperature of a developing solution for another developer nozzle is adjusted. The temperature regulation may be carried out by a control unit that stores data showing relationship between types of resists on the substrate to be developed or specific geometrical characteristics of patterns of the resists and developing solution temperatures suitable therefor, and that controls, based on the data, the temperature regulating unit to adjust the temperature of a developing solution to a value suitable for a resist to be developed.

Each or the developer nozzles may be provided with, in addition to the temperature regulating unit, a concentration control unit for controlling a concentration of the developing solution. In this case, the temperature and the concentration of the developing solution for a selected developer nozzle may be adjusted according to the type of the resist or the specific geometrical characteristic of the pattern of the resist. Preferably, while one developer nozzle is selected, the temperature and the concentration of a developing solution for another developer nozzle are adjusted. The control of the temperature and the concentration may be performed by a control unit that stores data showing relationship between types of resists or specific geometrical characteristics of patterns of the resists and developing solution temperatures suitable therefor and developing solution concentrations suitable therefor, and that controls, based on the data, the temperature regulating unit and the concentration control unit to adjust the temperature and the concentration of a developing solution to values suitable for a resist to be developed.

Preferably, the developing apparatus is further provided with a surface treatment liquid nozzle that supplies a surface treatment liquid to the surface to enhance wettability of the surface before the developing solution is supplied to the surface of the substrate. Alternatively, the developing apparatus is further provided with a rinse liquid nozzle that supplies a rinse liquid to the surface of the substrate after the developing solution is delivered to the surface; and an surfactant supply nozzle that supplies a surfactant to the surface of the substrate after the rinse liquid is supplied to the surface through the rinse liquid nozzle.

Preferably, the movement of the developer nozzle from the outer portion of the substrate toward the center portion of the substrate is stopped when an end, on a side of the center portion of the substrate, of the ejection port of the developer nozzle has reached a position corresponding to the rotational axis of the substrate.

According to a second aspect of the present invention, there is provided a developing method including the steps of: holding a substrate in a horizontal attitude on a substrate holding unit, the substrate having an exposed resist thereon; moving a developer nozzle, ejecting a developing solution in a form of a strip having a width oriented toward a central portion of the substrate, from a periphery of the substrate toward a center portion of the substrate, while rotating the substrate about a vertical axis, thereby spirally supplying the developing solution onto a surface of the substrate while allowing the developing solution to flow radially outwardly; and stopping supplying the developing solution through the developer nozzle and supplying a rinse liquid to the surface of the substrate through a rinse liquid nozzle. The supply of the rinse liquid may be initiated at the same time as the stoppage of supply of the developing solution, or it may be initiated slightly (e.g., 2 seconds or less) before or after the stoppage of supply of the developing solution.

Preferably, the ejection port of the developer nozzle has a width in a range of 0.1 mm to 1 mm and a length in a range of 8 mm to 15 mm.

Preferably, the temperature of the developing solution is controlled according to a type of the resist, to be developed, on the substrate or a specific geometrical characteristic of a pattern of the resist.

Preferably, the developing method further includes a step of selecting one of a plurality of developer nozzles, which have been set to eject developing solutions at different temperatures, based on a type of the resist to be developed on the substrate or a specific geometrical characteristic of a pattern of the resist. Preferably, the developing method further includes a step of, while one developer nozzle is selected, adjusting the temperature of a developing solution for another developer nozzle.

Preferably, the temperature and concentration of the developing solution are controlled according to a type of the resist, to be developed, on the substrate or a specific geometrical characteristic of a pattern of the resist.

Preferably, the rinse liquid nozzle is moved to a position near the developer nozzle before the developer nozzle stops ejecting the developing solution.

The developing solution supplying step may include a step of moving the developer nozzle from the periphery of the substrate toward the center portion of the substrate a plurality of times while ejecting a developing solution through the developer nozzle.

The developing solution supplying step includes a step of supplying the developing solution to the center portion for a predetermined period of time, after moving the developing solution nozzle from the periphery of the substrate toward the center portion of the substrate.

The developing method may further include a step of supplying a surface treatment liquid to the surface of the substrate to enhance wettability of the surface of the substrate, before supplying the developing solution. Alternatively, the developing method may further include the steps of: supplying a rinse liquid to the surface of the substrate after supplying the developing solution; and supplying a surfactant to the surface of the substrate, after supplying the rinse liquid.

In one preferred embodiment, the movement of the developer nozzle from the outer portion of the substrate toward the center portion of the substrate is stopped when an end, on a side of the center portion of the substrate, of the ejection port of the developer nozzle has reached a position corresponding to the rotational axis of the substrate.

BRIEF DESCRIPTION OF THE DRAWINGS

FIG. 3 is a perspective view of a developer nozzle of the developing apparatus.

FIG. 10 is a diagram illustrating ejection ports for a developer nozzle in other embodiments.

DESCRIPTION OF PREFERRED EMBODIMENTS

Figure 1:
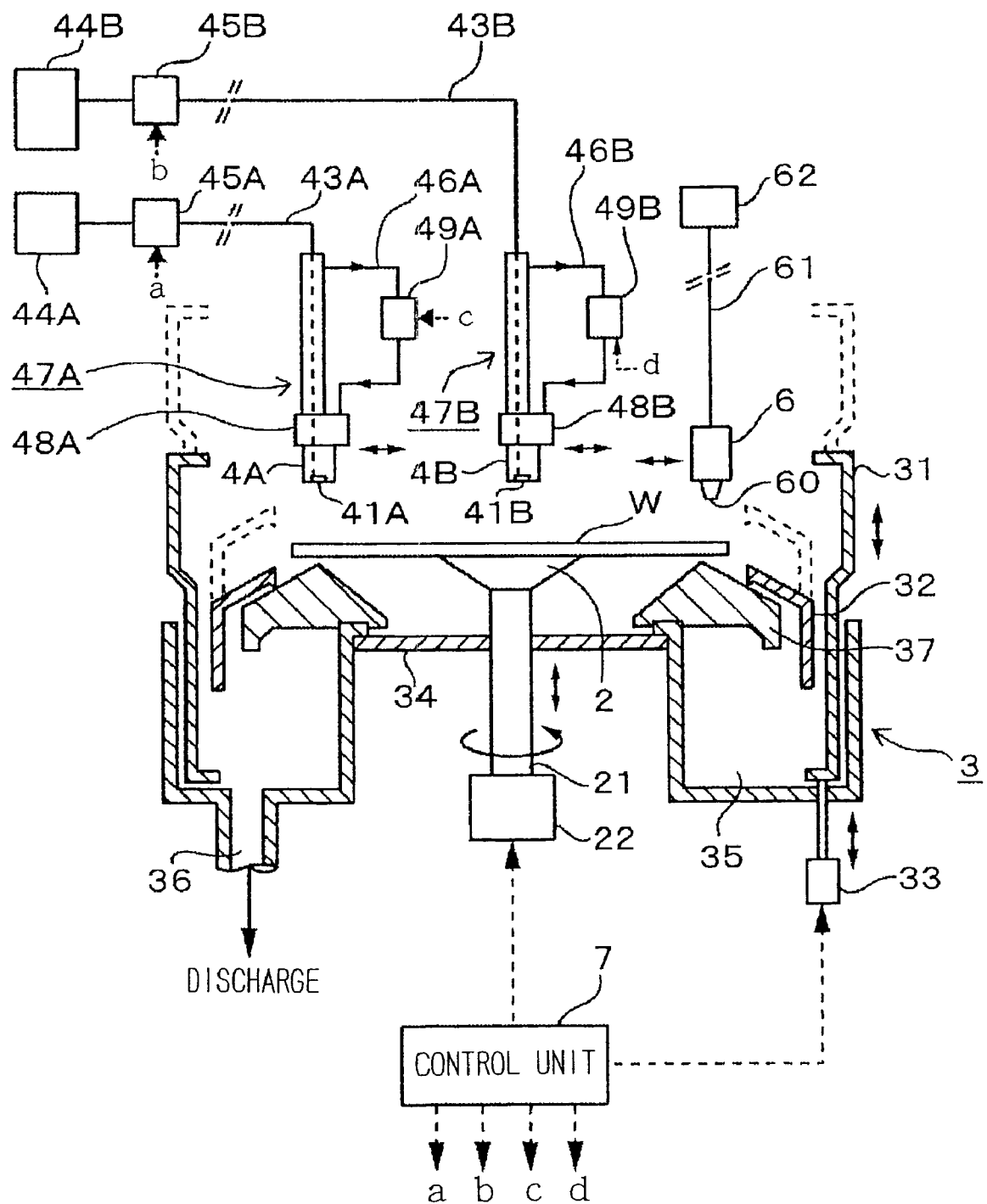
FIG. 1 is a vertical cross-sectional view of a developing apparatus in one embodiment of the present invention.

A developing apparatus in one embodiment of the present invention will be described with reference to FIGS. 1 and 2. Reference numeral 2 denotes a spin chuck (i.e., a substrate holding unit) for holding a substrate (e.g., a wafer W) in a horizontal attitude by holding the center portion of the back side of the substrate by suction. The spin chuck 2 is connected to a drive mechanism 22 through a rotational shaft 21 and can be rotated, raised and lowered together with the wafer W held thereon, by the drive mechanism 22. In the illustrated embodiment, the wafer W is set on the spin chuck 2 such that the center of the wafer W is located on the rotational axis line of the spin chuck 2. However, in the present invention, the center of the wafer W need not necessarily be positioned on the rotational axis. The center of the wafer W may be located in a circular region of a radius in a range of 1 to 15 mm centered about the rotational axis.

A cup set 3 is provided so as to surround the wafer W held on the spin chuck 2. The cup set 3 comprises an inner cup 32 and an outer cup 31 each having an opened top end. The outer cup 31 has an upper portion thereof having a shape of a rectangular tube and a lower portion thereof having a cylindrical shape. The inner cup 32 has a shape of a cylinder having an upper portion thereof tapered inwardly. The outer cup 31 is raised and lowered by an elevating mechanism 33 connected to the lower end of the outer cup 31. The inner cup 32 is raised when a shoulder formed on the inner circumferential surface of the lower end of the outer cup 31 pushes the inner cup 32.

A circular plate 34 is provided below the spin chuck 2. A liquid receiver 35 having a shape of a substantially rectangular groove in cross section is provided outside the circular plate 34 to extend along the entire circumference of the circular plate 34. A drain port 36 is formed in the bottom of the liquid receiver 35. The developing solution and the rinse liquid that have dropped or been spun off from the wafer W are trapped within the liquid receiver 35, and are discharged from the developing apparatus through the drain port 36. A ring member 37 having a substantially triangular cross-sectional shape is provided outside the circular plate 34. Three lifting pins (not shown) penetrate through the circular plate 34. These lifting pins and a not shown substrate conveyer cooperate to allow the wafer W to be transferred to and from the spin chuck 2.

There will now be described a developer supply means for delivering a developing solution (i.e., developer) to the surface of the wafer W. The developer supply means includes a first developer nozzle 4A and a second developer nozzle 4B that are capable of vertical movement and horizontal movement. The developer nozzles 4A and 4B have the same configuration. Each component of the developer nozzle 4B corresponding to that of the developer nozzle 4A is denoted by the same reference number while the suffix "A" attached to the reference numeral of the latter is replaced with the suffix "B" attached to the reference numeral of the former.

As shown in FIG. 3, the developer nozzle 4A may be formed in a wedge shape whose width is reduced as approaching the lower end thereof. An ejection port 41A having a shape of an elongated slit is formed in the lower end surface of the nozzle to eject a developing solution in a form of a strip. The open end of the ejection port 41A has a rectangular shape and has a length L1 in a range of 8 to 15 mm and a width L2 in a range of 0.1 to 1 mm, preferably 0.1 to 0.5 mm. When ejecting a developing solution, the ejection port 41A is positioned such that its length L1 direction (longitudinal direction) thereof aligns with a line passing through the peripheral edge of the wafer W and the center portion of the wafer W. It should be noted that "the line passing through the peripheral and the center portion of the wafer W need not necessarily be a radial line passing through the center of the wafer W. That is, it is only necessary that the length L1 direction of the ejection port 41A be substantially aligned with a radial direction of the wafer W. The open end of the ejection port need not necessarily have an exact rectangular shape in cross section. Thus, corners of the rectangle may be rounded; a short side of the rectangle may be oblique; and/or the open end of the ejection port may have a serpentine profile.

Figure 4:
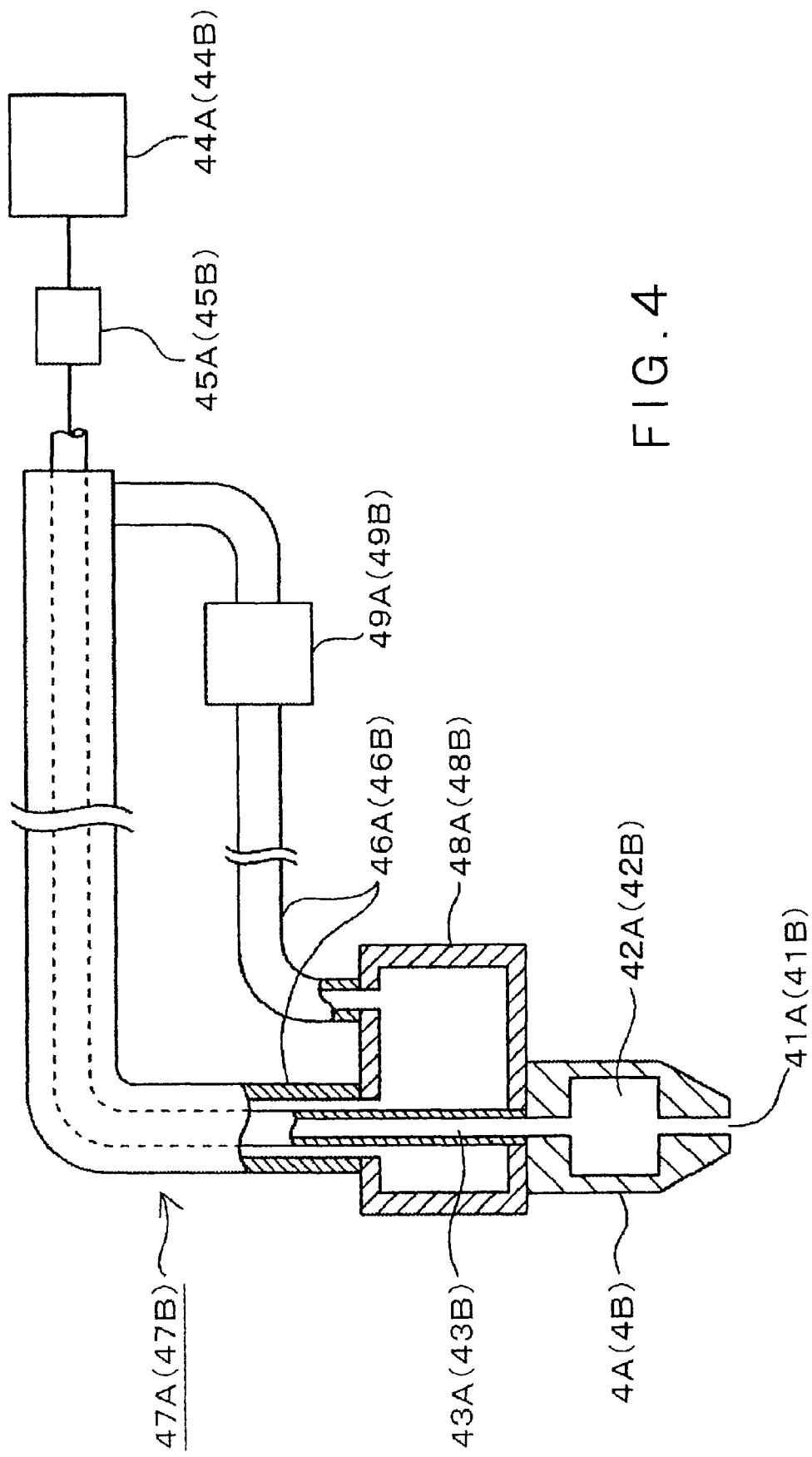
FIG. 4 is a diagram illustrating a developer supply means of the developing apparatus.

As shown in FIG. 4, the ejection port 41A is communicated with a liquid buffer portion (or liquid buffer chamber) 42A formed within the developer nozzle 4A. The liquid buffer portion 42A is connected to one end of a developer tube 43A (supply passage), and the other end of the developer tube 43A is connected to a developer supply source 44A. A main temperature regulating unit 45A for adjusting the temperature of a developing solution and a liquid feeding means (not shown) are provided in the developer tube 43A. For example, the main temperature regulating unit 45A may be a heat exchanger, and the liquid feeding means may be a bellows pump whose discharge flow rate can be controlled by changing the discharge stroke. A portion of the developer tube 43A runs inside of a temperature-control water tube 46A that constitutes a temperature-control water flow passage, thus forming a double tube structure 47A composed of the developer tube 43A and the temperature-control water tube 46A. In the example shown, a temperature-control water buffer portion (temperature-control water buffer chamber) 48A is provided on the liquid buffer portion 42A, and the temperature-control water tube 46A is connected to the upper end of the temperature-control water buffer portion 48A. Thus, the double tube structure 47A runs from the upper end of the temperature-control water buffer portion 48A to a predetermined position along the upstream portion of the developer tube 43A. The double tube structure 47A constitutes an auxiliary temperature regulating unit. Heat is exchanged between the developing solution and the temperature-control water through the tube wall separating the developer passage from the temperature-control water passage (i.e., the tube wall of the developer tube 43A), in order to adjust the temperature of the developing solution to a predetermined value. The temperature-control water tube 46A leaves the developer tube 43A at one end of the double tube structure 47A and extends to the temperature-control water buffer portion 48A. Therefore, the temperature-control water tube 46A forms a circulation passage, in which a temperature regulating unit 49A (for example, a heat exchanger) is provided. The main temperature regulating unit 45A and the double tube structure 47A (functioning as an auxiliary temperature regulating unit) are capable of adjust the temperature of the developing solution to a predetermined value in a range of 5° C. to 60° C., for example. Note that one of the main temperature regulating unit 45A and the auxiliary temperature regulating unit may be omitted.

Referring back to FIG. 2, the developer nozzles 4A (4B) is supported on one end of a nozzle arm 5A (5B). The other ends of the nozzle arm 5A (5B) is connected to moving base 51A (51B) including an elevating mechanism (not shown). The moving base 51A (51B) can be moved along the guide member 52A (52B) extending on the bottom surface of the enclosure of this developing apparatus (developing unit) in the X-direction. Further, in the figure, reference numeral 53 denotes a waiting area for the developer nozzle 4A (4B). The tip portion of each nozzle is cleaned, etc. in the nozzle waiting area 53.

The developing apparatus further includes a rinse liquid nozzle 6 which is capable of horizontal movement and vertical movement. The rinse liquid nozzle 6 has a fine ejection port 60 for ejecting a rinse liquid such as deionized water against the wafer W when it faces the surface of the wafer W. A rinse liquid supply source 62 is connected to the rinse liquid nozzle 6 through a rinse liquid tube 61 (i.e., a supply passage) (see FIG. 1), which is provided therein with a liquid feeding means (not shown), for example, a bellow pump whose discharge flow rate can be controlled by changing the discharge stroke. The rinse liquid nozzle 6 is connected through a nozzle arm 63 to a moving base 64 including an elevating mechanism (not shown). The moving base 64 is moved along the guide member 52A, shared by the moving base 51A for the developer nozzle 4A, such that the first developer nozzle 4A and the rinse liquid nozzle 6 do not interfere with each other. In FIG. 2, reference numeral 65 denotes a waiting area for the rinse liquid nozzle 6.

Figure 2:
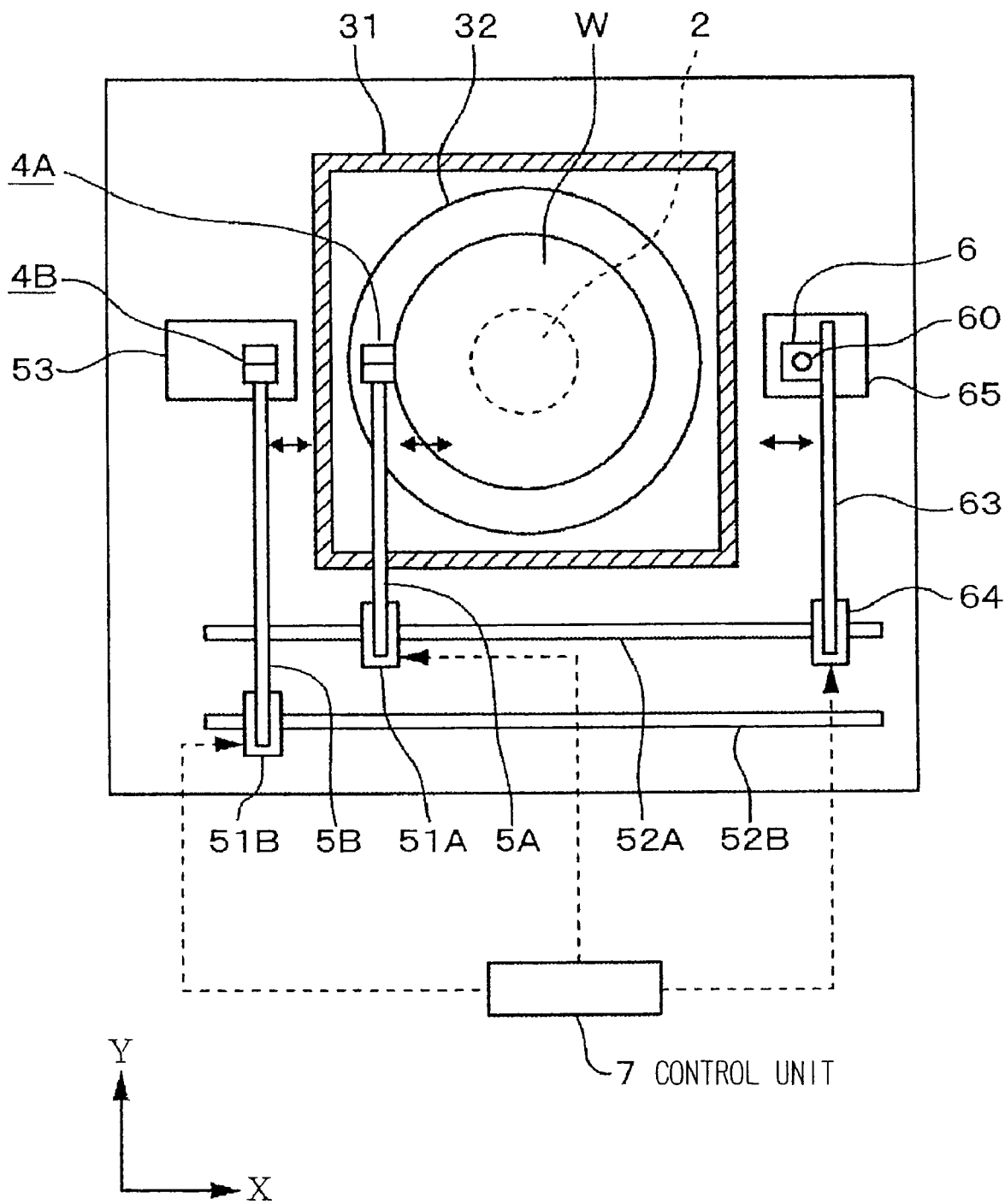
FIG. 2 is a plan view of the developing apparatus in one embodiment of the present invention.

Referring to FIG. 2, reference numeral 7 denotes a control unit for controlling the entire operation of the developing apparatus. Specifically, the control unit 7 has functions to: control the operations of the drive mechanism 22, the lifting/lowering unit 33, and the moving bases 51A, 51B and 64; and control the temperature control operations of the main temperature regulating unit 45A (45B), the double tube structure 47A (47B) (i.e., the auxiliary temperature regulating unit), and the temperature regulating unit 49A (49B) so as to adjust the temperature of the developing solution supplied to the surface of the wafer W to the predetermined value. A storage unit (e.g., a memory) provided in the control unit 7 stores data showing relationship between various types of resists and developing solution temperatures (which is in a range of 5° C. to 60° C.) suitable for developing respective types of resists. The control unit 7 refers to this data to determine the developing solution temperature for the type of resist coated on the wafer W to be developed. In other words, the control unit 7 determines the temperature of the developing solution based on the dissolution characteristics of each type of resist in the developing solution and controls the operation of each temperature regulating unit accordingly. The control unit 7 may be adapted such that the operator enters the developing solution temperature by using an input means of the control unit 7, instead of automatically determining it based on the data stored in the memory as described above.

The following are exemplary developing solution temperatures. When the resist to be developed is for a KrF light source and has a low dissolution rate in the developing solution, the developing solution temperature may be set in the range of 40° C. to 60° C. When the resist is for an ArF light source (studied for application in recent years) and has a high dissolution rate in the developing solution, the developing solution temperature may be set in the range of 20° C. to 40° C. In the case of a resist for an i-ray source or a g-ray source, which readily dissolves at low temperatures, the developing solution temperature may be set in the range of 10° C. to 20° C. The developing solution temperature for each resist is determined based on the temperature at under which dissolution of the resist is promoted, not on the type of the light source used to expose the resist.

Then, process steps for developing the wafer W by using the developing apparatus will be described. The developing apparatus is initially set such that: the outer cup 31 and the inner cup 32 are located at their lowered positions; and the developer nozzles 4A and 4B and the rinse nozzle 6 are positioned above the nozzle waiting areas 53 and 65, respectively. First, a wafer W having an exposed resist thereon is transferred to the developing apparatus by a substrate conveyer (not shown). This substrate conveyer and lifting pins (not shown) cooperates to transfer the wafer W to the spin chuck 2. Before the wafer W is transferred to the spin chuck 2, the control unit 7 determines the developing solution temperature based on the type of resist coated on the wafer W and based on information stored in the memory (described above). Furthermore, the control unit 7 selects a nozzle used for development of this wafer W from the two developer nozzles 4A and 4B (in this example, selects the first developer nozzle 4A), and causes the main temperature regulating unit 45A and the auxiliary temperature regulating unit to adjust the temperature of the developing solution to be ejected through the selected developer nozzle 4A such that it coincides with the determined developing solution temperature. As a result, the temperature-controlled developing solution stored in the developing solution buffer portion 42A and in the developer tube 43A upstream of the developing solution buffer portion 42A is ready to be ejected through the developer nozzle 4A.

Figure 5:
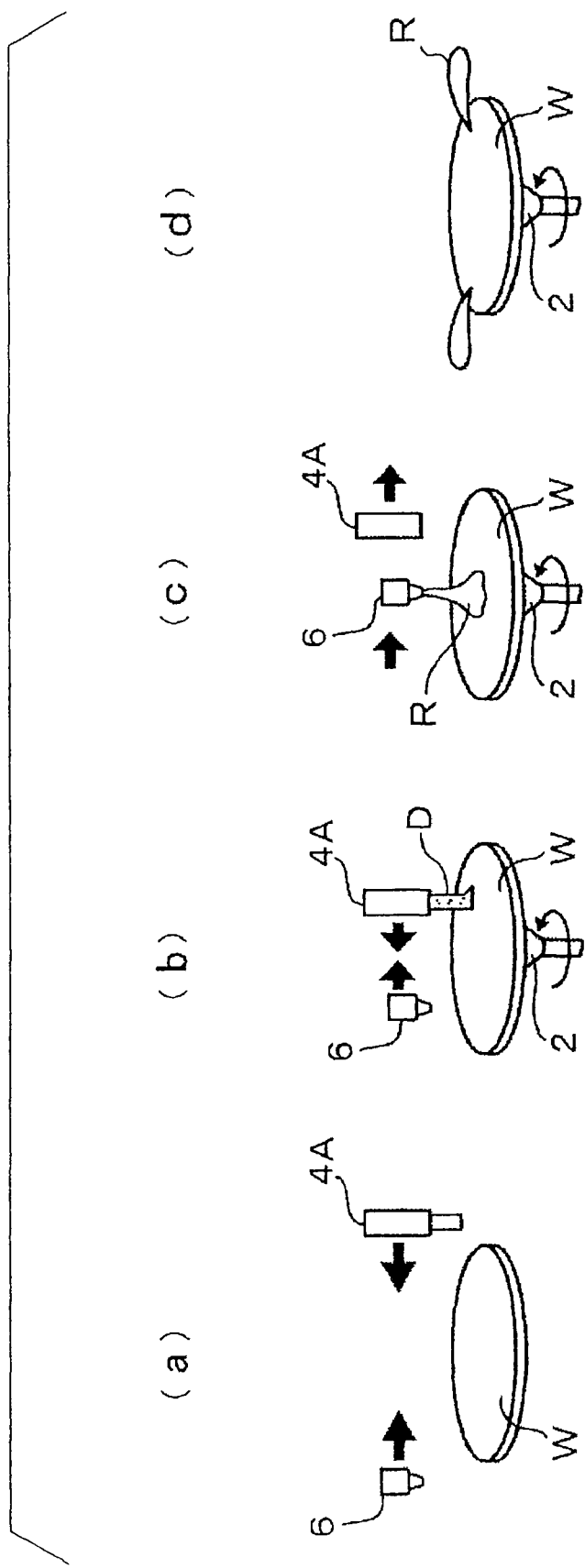
FIG. 5 is a diagram showing process steps of developing a wafer by using the developing apparatus.

Then, the outer cup 31 and the inner cup 32 are moved to their raised positions, and the selected developer nozzle 4A is moved to a developer-ejection start position which is slightly outside the peripheral edge of the wafer W on one side of the wafer W and is slightly higher than the surface of the wafer W, while the rinse liquid nozzle 6 is moved so as to position the ejection port 60 at a location which is slightly outside the peripheral edge of the wafer W on the opposite side of the wafer W and is slightly higher than the surface of the wafer W, as shown in FIG. 5(a). In the illustrated embodiment, the ejection port 41A of the developer nozzle 4A is located 1 to 20 mm higher than the surface of the wafer W. Note that, although the other developer nozzle 4B is staying above the nozzle waiting area 53 at present, preparation for processing of the next wafer W is carried out while this wafer W is being processed, as described later.

Then, the developer nozzle 4A moves from outside the wafer W toward the center portion along a line passing through the rotational center of the wafer W while ejecting a developing solution in a form of a strip from the ejection port 41A and while rotating the wafer W around a vertical axis at a rotational speed of 500 rpm or higher, for example, 1000 rpm-1200 rpm. In the case of an eight inch wafer W, for example, the moving speed of the developer nozzle 4A is set such that it takes 1-2 seconds for the nozzle to move from the peripheral edge of the wafer W to a position above the center portion of wafer W, for example, the center of the wafer W. It should be noted that the rotational speed of the wafer W and the moving speed of the nozzle are preferably set such that a strip of developing solution D are coated on the wafer W without any gap being defined between radially adjacent portions of the strip. These speeds may be determined through calculation based on the width of the strip of developing solution D, i.e., the length L1 of the ejection port 41A, through experiments conducted beforehand. The developer nozzle 4A may be moved such that the ejection port 41A is moved along a line slightly translated from a line passing through the rotational center of the wafer W; for example, the ejection port may be moved along a line passing through a region defined between the above line (passing through the rotational center) and a parallel line spaced from it by a distance of 1 mm. Note that the present inventors have found, through experiments, that it is not possible to ensure a desired in-plane uniformity of the line width of a pattern if it is developed at a wafer rotational speed of less than 500 rpm.

Figure 6:
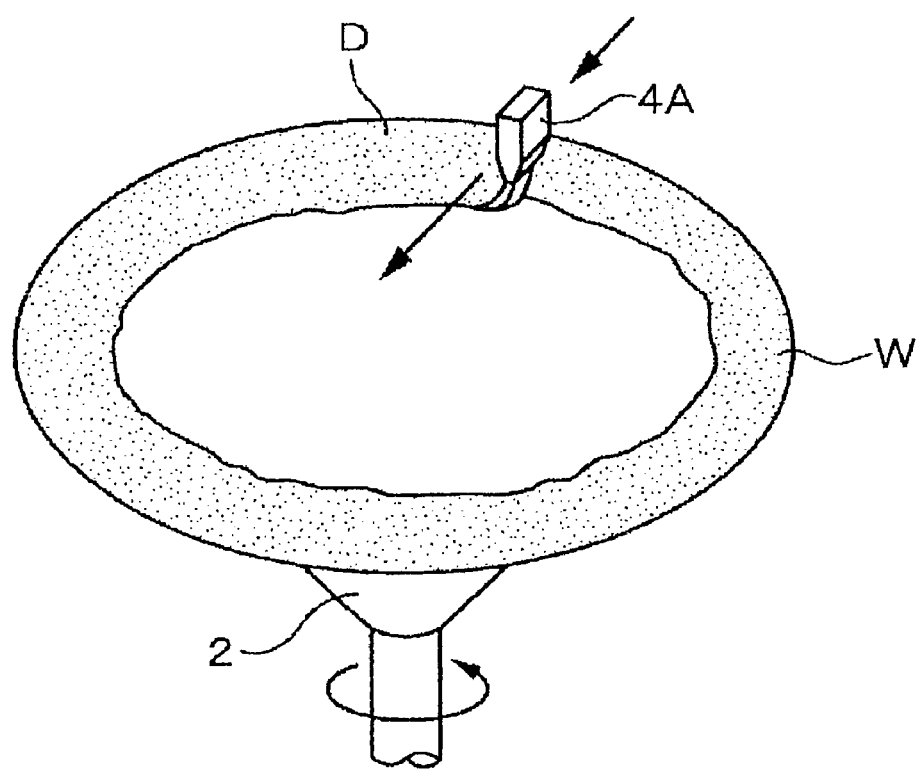
FIG. 6 is a diagram illustrating the way of supplying a developing solution to the surface of a wafer.
Figure 7:
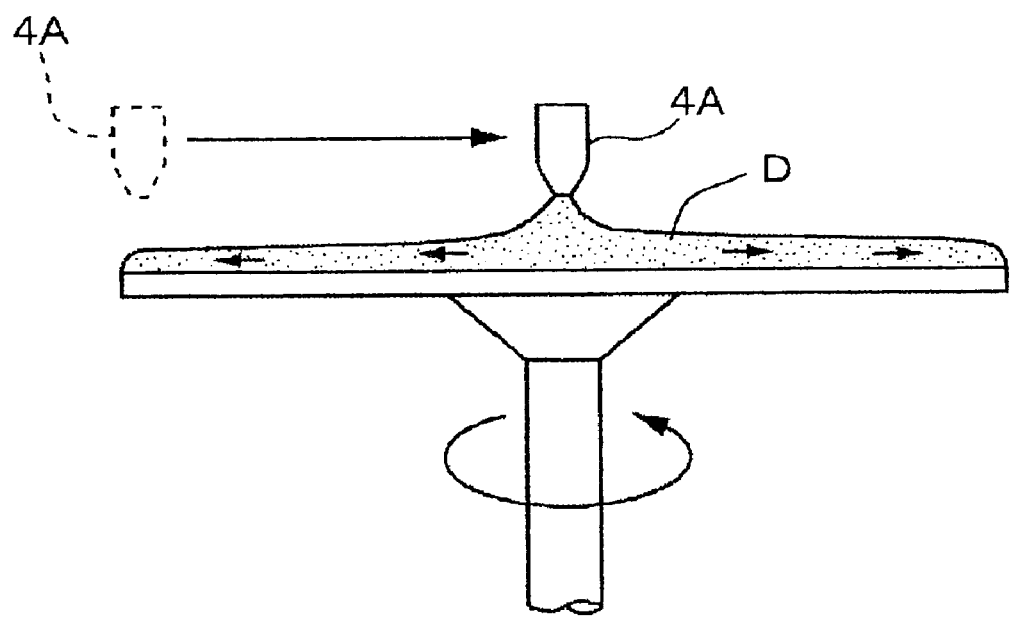
FIG. 7 is a diagram illustrating the way of supplying the developing solution to the surface of the wafer.
Figure 8:
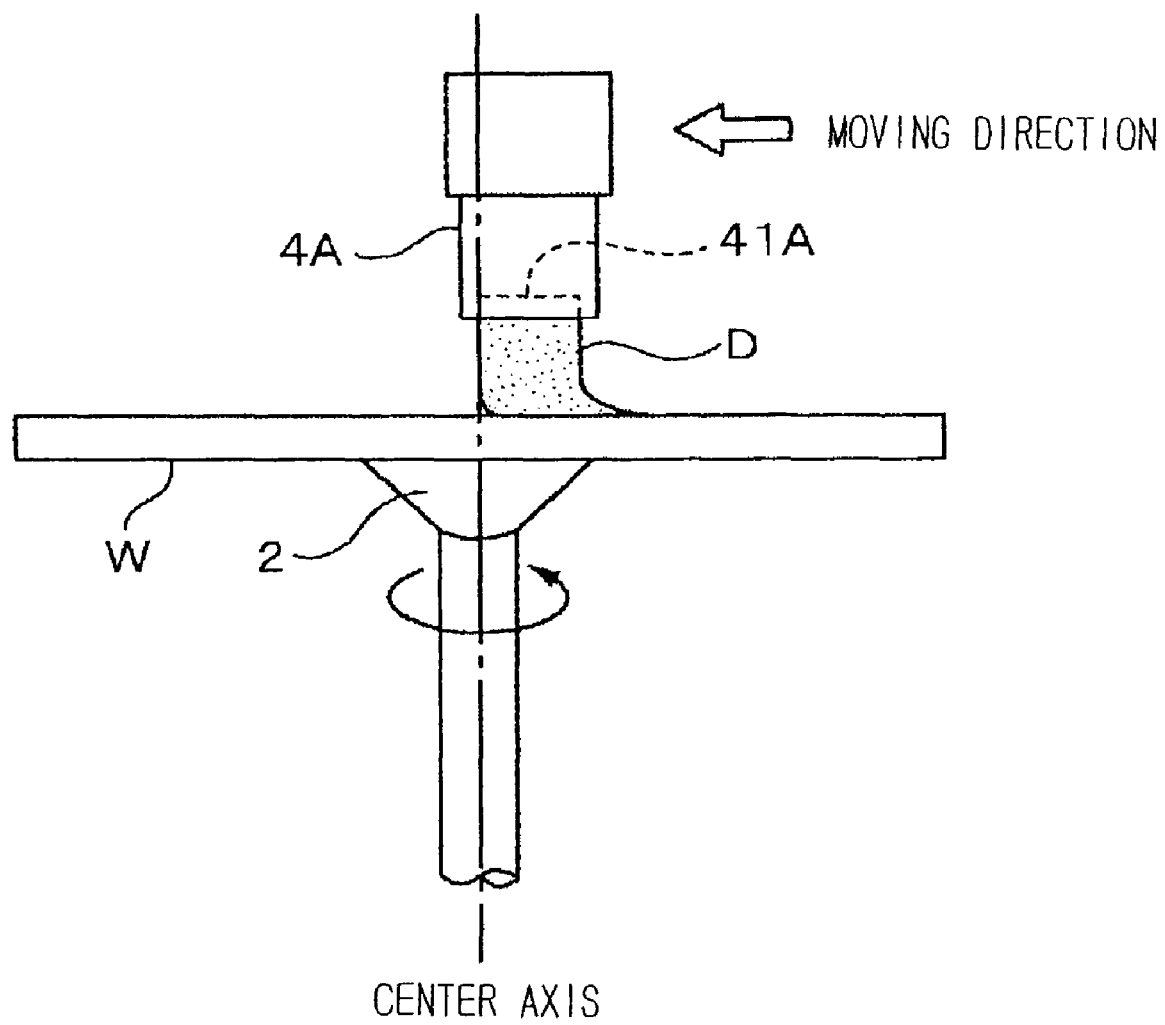
FIG. 8 is a diagram illustrating the stop position of a developer nozzle.

According to the above coating method, as shown in FIG. 6, a strip-shaped developing solution D is spirally applied to the surface of the wafer W so that no gaps are formed between radially adjacent portions of the spiral strip, thus covering the entire surface of the wafer W with the developing solution D. Since the wafer W is rotated, the developing solution D spreads outward on the surface of the wafer W due to centrifugal force, thereby forming a thin liquid film on the surface of the wafer W, as shown in FIG. 7. The portions of the resist soluble in the developing solution D dissolve, while those portions of the resist insoluble in the developing solution D do not dissolve and remain, to form a resist pattern.

When the ejection port 41A has reached the center of the wafer W, in other words, when the vertical projection of the ejection port 41A onto the wafer surface has reached the rotational center of the wafer, the developer nozzle 4A stops moving and the ejection of the developing solution through the ejection port 41A is stopped. Immediately thereafter, the developer nozzle 4A is moved from above the wafer W to its retracted position. The nozzle is preferably stopped when the edge of the ejection port 41A on the wafer W center side, that is, the leading edge of the ejection port 41A, has reached the rotational center line of the wafer W or a point slightly (for example, 1 mm or less) beyond the center line. This procedure is advantageously reduces an area of the wafer W in the center portion thereof to which a developing solution is applied twice.

It is acceptable if there are minute gaps between raidially adjacent portions of the strip of the developing solution immediately after the developing solution is coated onto the wafer W. These minute gaps disappear when the developing solution spreads due to centrifugal forces. It is also acceptable if radially adjacent portions of the strip of the developing solution overlap each other immediately after the developing solution is coated onto the wafer W. However, it is preferable to minimize the size of the overlap in order to save the developing solution.

At the same time that the developer nozzle 4A move toward the center of the wafer W, the rinse liquid nozzle 6 on the side of the wafer W diametrically opposite to the developer nozzle 4A is also moved toward the center of the wafer W and then stopped at a position (waiting position) slightly before a position above the center of the wafer W.

Immediately after the developer nozzle 4A stops the ejection of the developing solution and is moved from above the wafer W to its retracted position, the rinse liquid nozzle 6 staying at the waiting position moves to a position above the center of the wafer W and a rinse liquid R is ejected through the rinse liquid nozzle 6 for a predetermined period of time, as shown in FIG. 5(c). In this embodiment, as the developer nozzle 4A and the rinse liquid nozzle 6 are quickly switched, the developing time is substantially equal to the time required for moving the developer nozzle 4A from outside the wafer W toward the center of the wafer W. Note that the rinse liquid R may be supplied any time before the developing solution dries. Therefore, in order to ensure a developing time long enough to match the dissolution rate of the resist, the rinse liquid may be supplied an appropriate time after the ejection of the developing solution is stopped. The appropriate time varies depending on the rotational speed of the wafer W and may be, for example, 2 seconds or less at a wafer W rotational speed of 500 rpm or higher. In this case, the developing time is the sum of the traveling time (scan time) of the developer nozzle 4A and the period of time from a point of time when the developer nozzle 4A stops ejecting the developing solution to a point of time when the rinse liquid nozzle 6 begins to eject the rinse liquid R. Note that the ejection of the rinse liquid R need not necessarily be begun after stopping the ejection of the developing solution D. That is, ejection of the rinse liquid R may be initiated just before stopping the ejection of the developing solution D.

The rinse liquid R supplied to the surface of the wafer W spreads outward on the surface due to centrifugal force, washing away the developing solution containing dissolved resist components from the surface of the wafer W to clean the surface. Then, the ejection of the rinse liquid R is stopped and the rinse liquid nozzle 6 is moved from above the wafer W to its retracted position. After that, the wafer W is rotated at a high speed (e.g., 2000 rpm) so that the spin-drying of the wafer W, by which liquids on the wafer surface are spun-off, is performed, as shown in FIG. 5(d). Then, the outer cup 31 and the inner cup 32 are lowered and the wafer W is transferred from the developing apparatus by the substrate conveyer (not shown). In this way, the developing process is completed.

In a case where wafers W of a certain production lot (hereinafter referred to as "first production lot") are processed by using the developer nozzle 4A and wafers W of a next production lot (hereinafter referred to as "second production lot") are subsequently processed after completion of the processing of the first production lot, the developing solution temperature for the wafers W of the second production lot is determined based on the type of resist on these wafers W, and the main temperature regulating unit and the auxiliary temperature regulating unit assigned to the developer nozzle 4B, which is standing-by, control the temperature of the developing solution for the developer nozzle 4B before starting the process of the first wafer W of the second production lot. After completion of the development of the wafers W of the first production lot, the wafers W of the second production lot are developed by using the developer nozzle 4B according to the same procedure as described above. Note that, processing schedule data indicating the number and the type of wafers W (or the type of resist on the wafers W) to be processed is inputted beforehand into the memory of the control unit 7 through the input means. Based on this data, the control unit 7 determines the temperature of the developing solution to be prepared.

In the foregoing embodiment, the developing solution is supplied by moving the developer nozzle 4A (4B) in a substantially radial direction of the wafer W, with the slit-shaped ejection port 41A (41B) ejecting the developing solution, while the longitudinal direction of the ejection port 41A (41B) is substantially aligned with the radial direction. Thus, the following advantages are achieved. As a greater length L1 of the ejection port 41A (41B) results in a greater width of the strip of the developing solution supplied to the wafer W, allowing the moving speed of the developer nozzle 4A (4B) to be increased. Thus, it is possible to reduce the time required for supplying the developing solution and hence the time required for the developing process. As a smaller width L2 of the ejection port 41A (41B) results in a reduced thickness of the developing solution coated on the surface of the wafer W, resulting in reducing the consumption of the developing solution. The present inventors obtained the following experimental results. With the puddle method (i.e., "stationary development"), 70 ml of developing solution was required to develop a 12-inch wafer W. On the other hand, the foregoing method required only 16.7 ml of developing solution to achieve the same line width accuracy. However, in an actual developing process, the amount of developing solution is preferably set to 20 ml or more in order to reliably wet all portions of the wafer W with the developing solution D (that is, to provide a safety margin). Note that, if the length L1 of the ejection port 41A (41B) is too long, the supply of developing solution to the center portion of the wafer W is not smooth, resulting in generation of mist. If the length L1 is too short, the rotational speed of the wafer W must be increased, resulting in some of the developing solution being spun-off from the wafer W. If the width L2 of the ejection port 41A (or 41B) is too large, a large amount of developing solution is consumed. If the width L2 is too small, it may not be possible to eject a developing solution in a form of a strip. Therefore, the length L1 of the ejection port 41A (41B) is preferably in a range of 8 to 15 mm; and the width L2 is preferably in a range of 0.1 to 1 mm, more preferably 0.1 to 0.5 mm.

According to the foregoing embodiment, as the wafer W is rotated when it is developed, in other words, when the developing solution is in contact with the resist, it is possible to remove dissolved resist components from the surface of the resist in contact with the developing solution, especially from valley portions of the resist pattern. Dissolved resist components left on the surface of the resist prevent further dissolution of the resist. Dissolved resist components can be removed from the surface of the wafer W by rotating the wafer W. Thus, the influence of the dissolved resist components is significantly reduced as compared with "stationary development", and thus a resist pattern with sufficient line-width accuracy can be formed. Note that after the supply of the developing solution, the wafer W need not necessarily be rotated continuously. Even if the wafer W is intermittently rotated, dissolved resist components can be removed as described above.

According to the foregoing embodiment, as the rinse liquid nozzle 6 is moved to a location near the rinse liquid ejection position and stands by at the location until the ejection of the developing solution through the developer nozzle 4A (4B) is stopped, the rinse liquid can be supplied immediately after the completion of the supply of the developing solution through the developer nozzle 4A (4B), thereby facilitating development of a resist having a high development rate. Instead of arranging the developer nozzle 4A (4B) and the rinse liquid nozzle 6 separately, rinse liquid nozzles 6 may be mounted to the nozzle arms 5A and 5B for the developer nozzles 4A and 4B, respectively. The rinse liquid nozzle 6 may be inclined so as to supply the rinse liquid from the foregoing waiting position toward the center of the wafer W, eliminating the time required to move the rinse liquid nozzle 6 from the foregoing waiting position to the rinse liquid ejection position.

Figure 9:
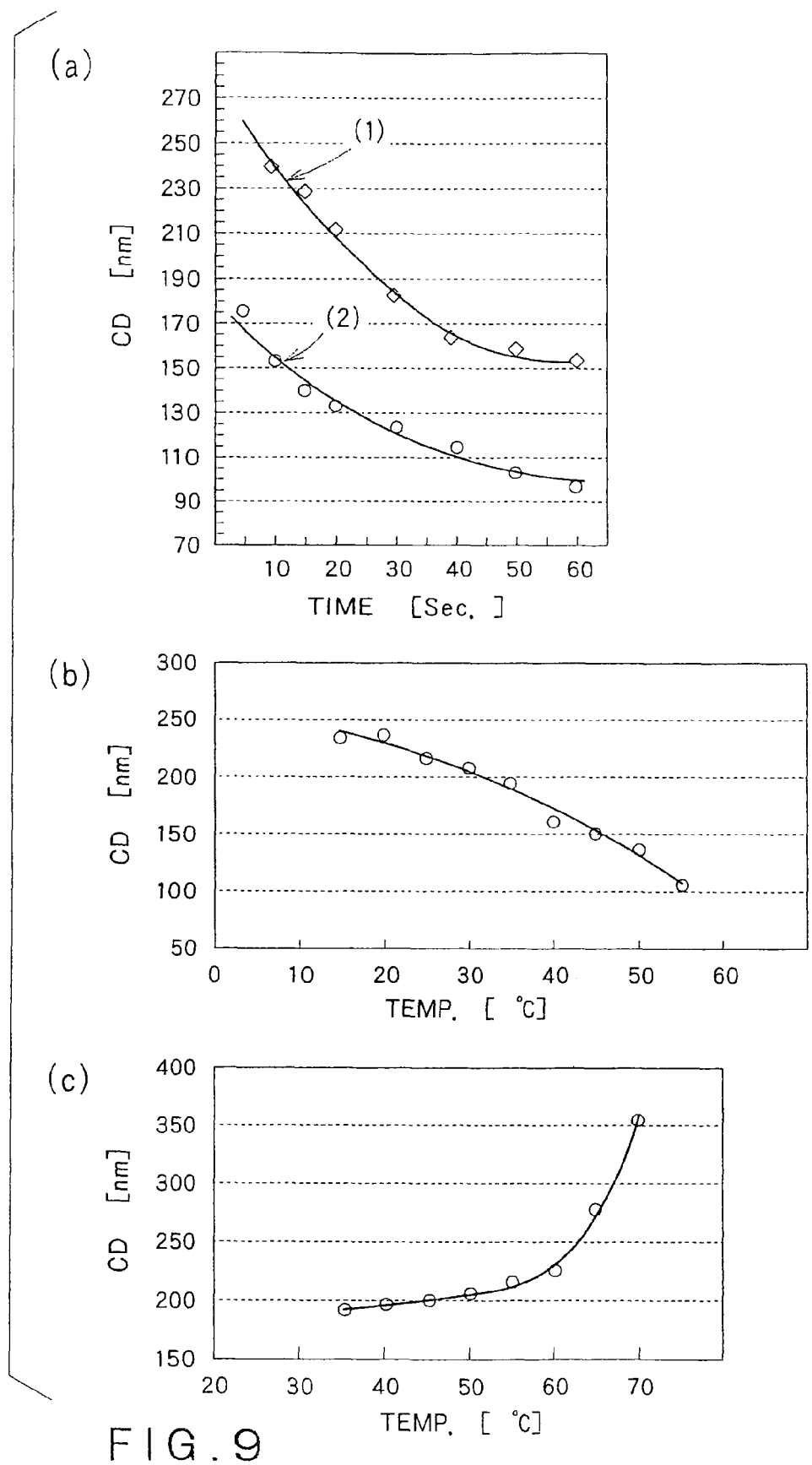
FIG. 9 shows graphs showing relationships between a line width of a pattern and a developing time or a developing solution temperature.

According to the foregoing embodiment, as a developing solution whose temperature is adjusted to a value in correspondence to the type of resist is supplied to the surface of the wafer W to develop the resist, it is possible to reduce the developing time of a resist having a low dissolution rate. Therefore, the developing times of resists having different dissolution rates can be equalized or made close to each other. This allows different types of resists to be developed by the same developing apparatus under the same process conditions except for developing solution temperature. In this case, if mechanisms included in the developing apparatus cannot accommodate the process conditions required by the resist having the highest dissolution rate, the process conditions may be set for a resist having a dissolution rate somewhat lower than the highest one. FIG. 9(a) shows the relationship between the developing time and the line width (CD) of the pattern for two developing solution temperatures, in a certain developing solution. Curve (1) shows the relationship at 23° C. (clean room temperature), and curve (2) shows the relationship at 50° C. The developing solution has a property that its resist dissolution rate increases with increasing in temperature. More specifically, if the desired line width is 150 nm, the time required to achieve the desired line width was 50-60 seconds at 23° C., and approximately 10 seconds at 50° C.

The developing time required to form an appropriate pattern varies depending on not only the type of resist but also geometrical factors specifying the pattern. Therefore, the developing solution temperature may be changed according to the geometrical factors. The geometrical factors of a pattern include its desired line width, pattern density, and pattern shape. The pattern shape may be specified, for example, based on the shape of the portion of the resist dissolved due to the developing process (for example, a straight groove, a cylindrical hole, etc.), and on the area ratio of the grooves and holes in the pattern. Specifically, the developing solution temperature may be lowered for dense patterns and raised for rough patterns. Note that the developing solution temperature may be changed according to both the type of resist and the geometrical factors of the pattern. FIGS. 9(b) and 9(c) are graphs illustrating experimental results, wherein: FIG. 9(b) shows the relationship between the developing solution temperature and the line width (CD) when forming grooves; and FIG. 9(c) shows the relationship between the developing solution temperature and the line width (CD) when forming holes. The developing time was 10 seconds in both cases. These graphs indicate that the pattern line width has greater temperature dependence when forming grooves than when forming holes. Therefore, when grooves and holes are formed at once, the developing solution temperature may be determined with placing priority on the developing conditions of the grooves.

According to the foregoing embodiment, the developing apparatus includes two separate developer nozzles 4A and 4B adapted to control the temperatures of the developing solution to be supplied therefrom at different values independently.

Therefore, when wafers W of a certain production lot are being processed by using one of the nozzles 4A and 4B, the temperature of the developing solution for the other nozzle can be adjusted to prepare for the processing of wafers W of the next production lot. Thus, the first wafer W of the next production lot can be processed immediately after completion of the development of the last wafer W of the current production lot, which eliminates loss of time incurred due to change in developing solution temperature, resulting in improved throughput.

According to the embodiment described above, since a developing solution is supplied from the developer nozzle 4A (4B) to the wafer W while moving the nozzle from the peripheral edge of the wafer W toward the center of the wafer W and while rotating the wafer W, any undeveloped region (i.e., any region not yet contact with any developing solution) of the wafer W is first supplied with a fresh developing solution containing no dissolved resist components. This reduces adverse effects of the dissolved resist components, so that a pattern of high line-width accuracy may be achieved.

The concentration of the developing solution may be controlled, in addition to its temperature. The concentration of the developing solution can be changed by changing the flow rate ratio between the developing solution and the deionized water mixed with it by using a flow rate control unit (not shown). Alternatively, a plurality of developer supply sources 48A (48B) may be provided so as to be able to supply developing solutions of different concentrations. With this arrangement, one of these developer supply sources 48 may be selected according to the desired developing solution concentration by switching valves. The flow rate control unit and these valves constitute a portion of a developing solution concentration control unit.

In the present invention, the number of times of the nozzle scanning operation, in which the developer nozzle 4A (4B) moves from the peripheral edge of the wafer W to the center portion of the wafer W is not limited to one, may be plural number (e.g., 2-4 times or more). The number of times of the scanning operation may be determined based on the time required to develop the resist. Specifically, in a case where it takes one second for the developer nozzle to move from the peripheral edge of the wafer W to the center portion of the wafer W, if the required developing time is 10 seconds, the scanning operation is performed ten times. In this case, the developing solution that is supplied first may be set to a different temperature and/or a different concentration than those of the developing solutions that are supplied next (and subsequently). It is preferable to determine the change in the temperature and the concentration of each developing solution through experiments. Specifically, in the second scanning operation, a developing solution having a lower concentration may be supplied, for example. This limits the development reaction (or dissolution of the resist) and causes the dissolved resist components to diffuse, thereby preventing uneven development reaction due to these dissolved resist components.

After the developer nozzle 4A (4B) is moved from the peripheral edge of the wafer W to the center portion of the wafer W, the developer nozzle 4A (4B) may be held at a position above the center portion of the wafer W for a predetermined period of time while continuing to supply the developing solution. The period during which the nozzle is held may be determined based on the developing time required for the resist to be developed. This step of holding the nozzle above the center portion of the wafer W while continuing to supply the developing solution through the nozzle may be combined with the foregoing step of performing a plurality of scaning operations.

Noted that it is not impossible to use the developing apparatus in the foregoing embodiment in such a manner that the developer nozzle 4A (4B) moves from the center portion of the wafer W to the peripheral edge of the wafer W, or moves from one end of the wafer W to the opposite end of the wafer W. However, when the developer nozzle is moved from the center portion of the wafer W to the peripheral edge of the wafer, the supplied developing solution may flow outward due to centrifugal force and the center portion of the wafer W may become dry, and thus such an operation requires special attention.

The developing apparatus may include only one developer nozzle, instead of the two developer nozzles 4A and 4B.

The above developing apparatus may be used while maintaining the developing solution at a temperature of 23° C., which is equal to the temperature of the clean room in which the developing apparatus is installed. Also in this case, uniform and favorable development of the wafer can be achieved due to the accurate temperature control function of the temperature regulating units.

The developer nozzle 4A (4B) may have an ejection port with one of the shapes shown in FIG. 10, instead of the ejection port 41A (41B) whose open end has an elongated rectangular shape. FIG. 10 shows plan views of ejection ports as viewed from below. Specifically, the ejection port shown in FIG. 10($a$) has an elliptical shape whose major axis is aligned in a radial direction of the wafer W; the ejection port shown in FIG. 10($b$) has a diamond shape whose longer diagonal is aligned in a radial direction of the wafer W; the nozzle shown in FIG. 10($c$) has a plurality of elongated rectangular ejection ports arrayed in a direction perpendicular to a radial direction of the wafer W; the nozzle shown in FIG. 10($d$) has a plurality of round ejection ports arrayed in a radial direction of the wafer W; and the nozzle shown in FIG. 10($e$) has a plurality of round ejection ports formed in a zigzag arrangement.

Before supplying the developing solution to the surface of the wafer W, the surface of the wafer W may be supplied with a rinse liquid, such as deionized water, as a surface treatment liquid for improving the wettability of the surface of the wafer W. This supply may be performed, for example, through the rinse liquid nozzle 6. Such a treatment is referred to in this specification as pre-wetting. Pre-wetting may be performed according to the following procedure.

Figure 11:
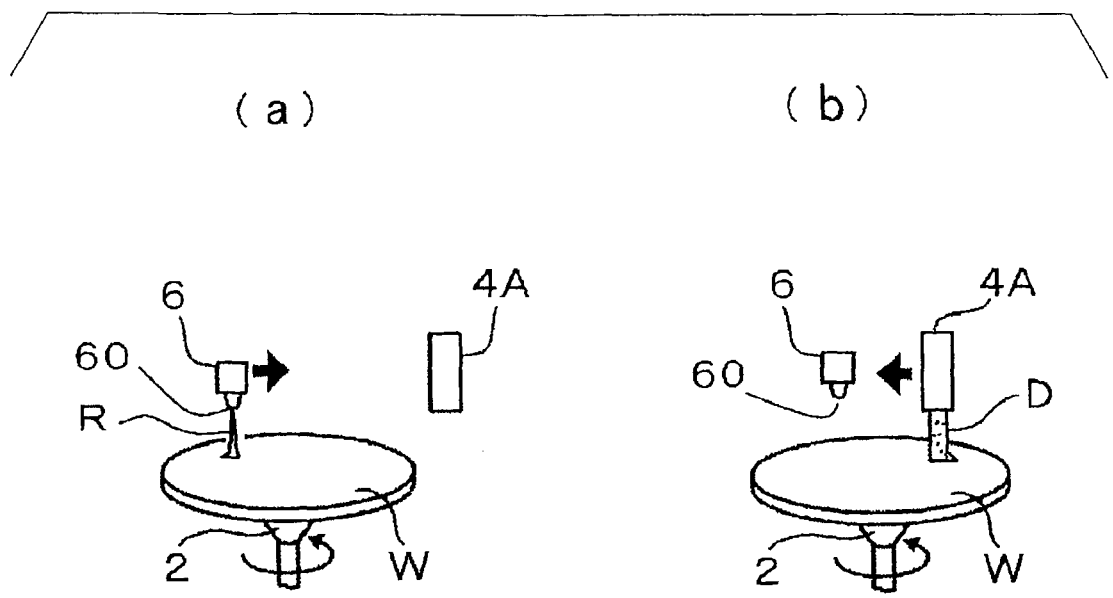
FIG. 11 is a diagram showing process steps of developing a wafer by using the developing apparatus in another embodiment.

After holding a wafer W in a horizontal attitude on the spin chuck 2, the rinse liquid nozzle 6 is moved from the peripheral edge of the wafer W toward the center portion of the wafer W while ejecting a rinse liquid through the ejection port 60 and while rotating the wafer W around a vertical axis, as shown in FIG. 11($a$). Then, as shown in FIG. 11($b$), the ejection of the rinse liquid is stopped and the rinse liquid nozzle 6 is moved to a position slightly removed from the center of the wafer W toward the peripheral edge of the wafer W. At the same time, the developer nozzle 4A (4B) is moved from the peripheral edge of the wafer W toward the center portion of the wafer W while ejecting a developing solution D through the ejection port 41A (41B), as previously described.

Supplying the developing solution after enhancing the wettability of the surface of the wafer W prevents the developing solution from forming droplets on the surface, allowing the developing solution to be reliably coated on the entire surface of the wafer W without increasing its amount, which is very advantageous in terms of reducing the developing solution consumption. Instead of scanning the wafer surface with the rinse liquid nozzle 6 ejecting a rinse liquid, the pre-wetting may be performed by supplying a rinse liquid through the rinse nozzle 6 positioned above the center portion of the wafer W while rotating the wafer W thereby spreading the rinse liquid over the entire surface of the wafer W by centrifugal force. A surface treatment liquid supply nozzle used exclusively for the pre-wetting may be provided separately from the rinse liquid nozzle 6.

Figure 12:
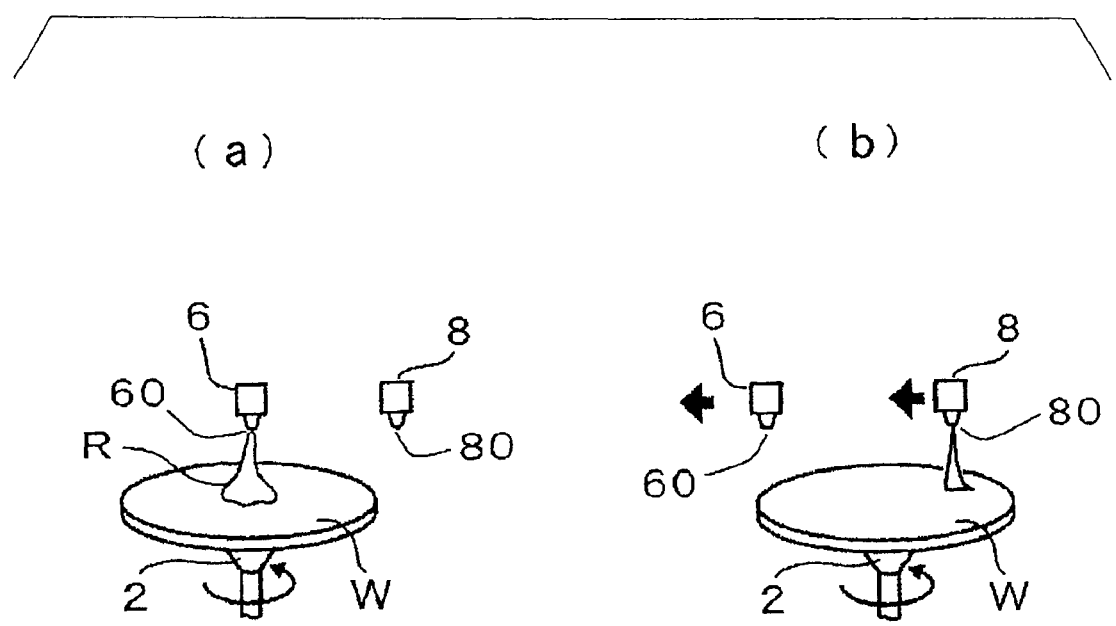
FIG. 12 is a diagram showing process steps of developing a wafer by using the developing apparatus in still another embodiment.

An surfactant supply nozzle, which may be of the same shape as the rinse liquid nozzle 6, may be provided in the developing apparatus to supply a surfactant to the surface of the wafer W to which a developing solution and a rinse liquid have been supplied; and the surfactant may be supplied to the surface of the wafer W before the spin-drying of the wafer W. Specifically, the surfactant may be supplied according to the following procedure. First, a rinse liquid R is supplied by the rinse liquid nozzle 6 to the surface of the wafer W to which a developing solution has been supplied, as shown in FIG. 12(*a*). Then, the supply of the rinse liquid R is stopped, and a surfactant supply nozzle 8 is moved from the peripheral edge of the wafer W toward the center portion of the wafer W while ejecting a surfactant through an ejection port 80, as shown in FIG. 12(*b*). Then, after stopping the supply of the surfactant, the surfactant supply nozzle 8 is moved from above the wafer W to its retracted position, and the wafer W is rotated at a high speed to spin-dry it.

The surfactant thus supplied reduces the friction between the resist surface and a liquid in contact with it. Thus, the liquid attached to the surfaces of the pattern (specifically, the liquid attached to valley portions of the pattern) is readily thrown from the wafer W without resistance in the spin-drying process. This prevents pattern collapse due to the pulling force of the liquid thrown from the wafer W in the spin-drying process. Instead of scanning the wafer surface with the surfactant supply nozzle 8 ejecting a surfactant, the surfactant may be supplied through the surfactant supply nozzle 8 positioned above the center portion of the wafer W while rotating the wafer W thereby spreading the surfactant over the entire surface of the wafer W by centrifugal force. Further, instead of supplying a surfactant after delivering a rinse liquid R, a component acting as a surfactant may be added to the rinse liquid R beforehand and may be supplied in the rinse process. In this case, the rinse liquid nozzle 6 also functions as the surfactant supply nozzle 8.

Figure 13:
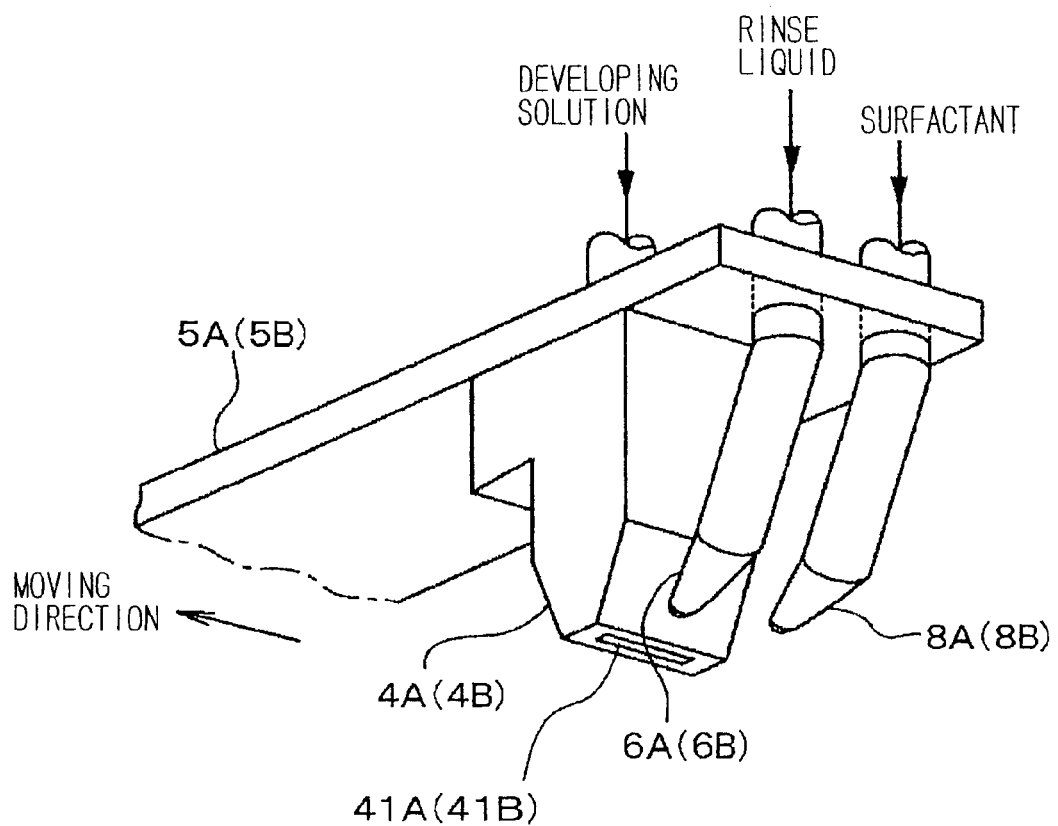
FIG. 13 is a diagram illustrating a developer nozzle in another embodiment.
Figure 14:
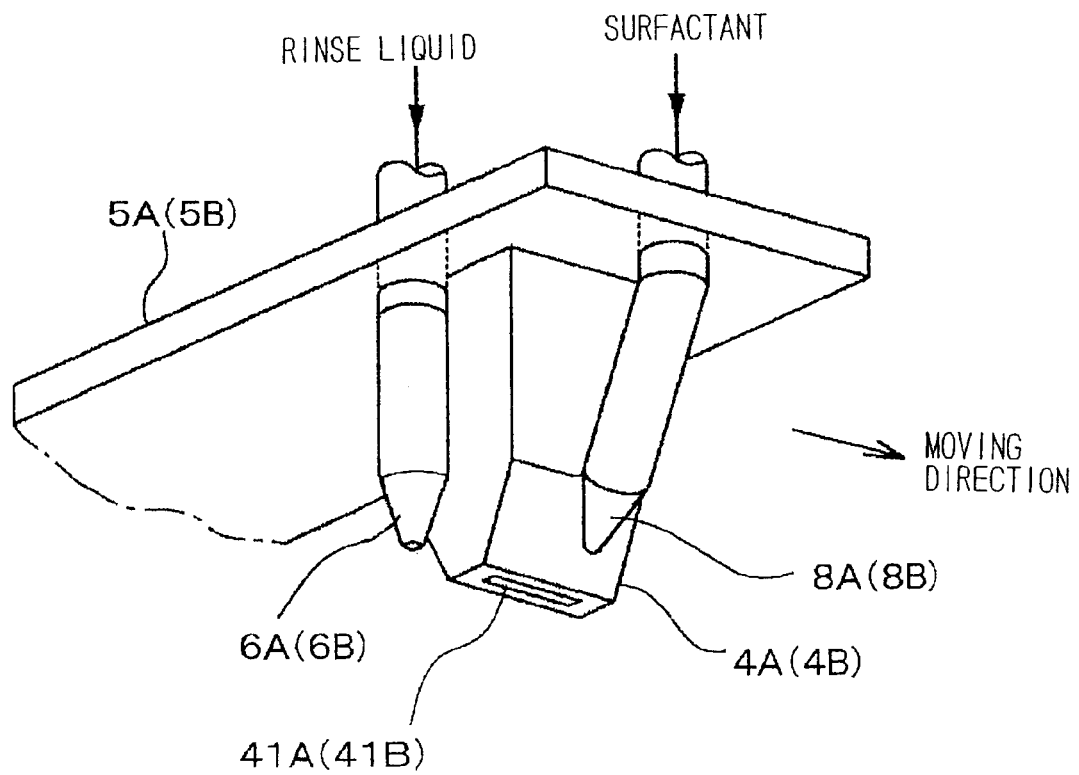
FIG. 14 is a diagram illustrating a developer nozzle in still another embodiment.

Instead of arranging the developer nozzle 4A (4B) and the rinse liquid nozzle 6 (and the surfactant supply nozzle 8, if provided) to be separately movable as described above, these nozzles may be mounted to a common nozzle arm. For example, as shown in FIG. 13, the rinse liquid nozzle 6 and the surfactant supply nozzle 8 may be mounted on the tip portion of the nozzle arm 5A (5B) on which the developer nozzle 4A is supported. In this case, the rinse liquid nozzle 6 and the surfactant supply nozzle 8 are inclined such that the axes of their ejection ports 60 and 80 pass through the center portion of the surface of the wafer W when the developer nozzle 4A (4B) is located at a position above the center portion of the wafer W. If a nozzle arm 5A (5B) is shared by the nozzles 4A (4B), 6, and 8, the configuration and the operation control of the developing apparatus can advantageously be simplified. The arrangement of the rinse liquid nozzle 6 and the surfactant supply nozzle 8 is not limited to that shown in FIG. 13. For example, as shown in FIG. 14, the rinse liquid nozzle 6 may be disposed behind the developer nozzle 4A (4B) with respect to the moving direction of the nozzles when a developing solution is ejected through the developer nozzle 4A (4B). Further, a nozzle which has a common ejection port for ejecting a developing solution and a rinse liquid (and a surfactant as necessary) may be used.

Instead of the foregoing mechanism for linearly moving the developer nozzle 4A (4B), a mechanism that swings the nozzle arm around a vertical axis. In this case, the developer nozzle 4A (4B) is moved from the peripheral edge of the wafer W toward the center portion of the wafer W along a circular arc to supply a developing solution to the wafer W.

In the present invention, the substrate processed in the above developing apparatus is not limited to a wafer W, and may be, for example, an LCD substrate or a reticle substrate for a photomask. Note that the above configuration of the developer nozzle 4A (4B) can be applied to a coating liquid nozzle for coating a resist onto a substrate.

Figure 15:
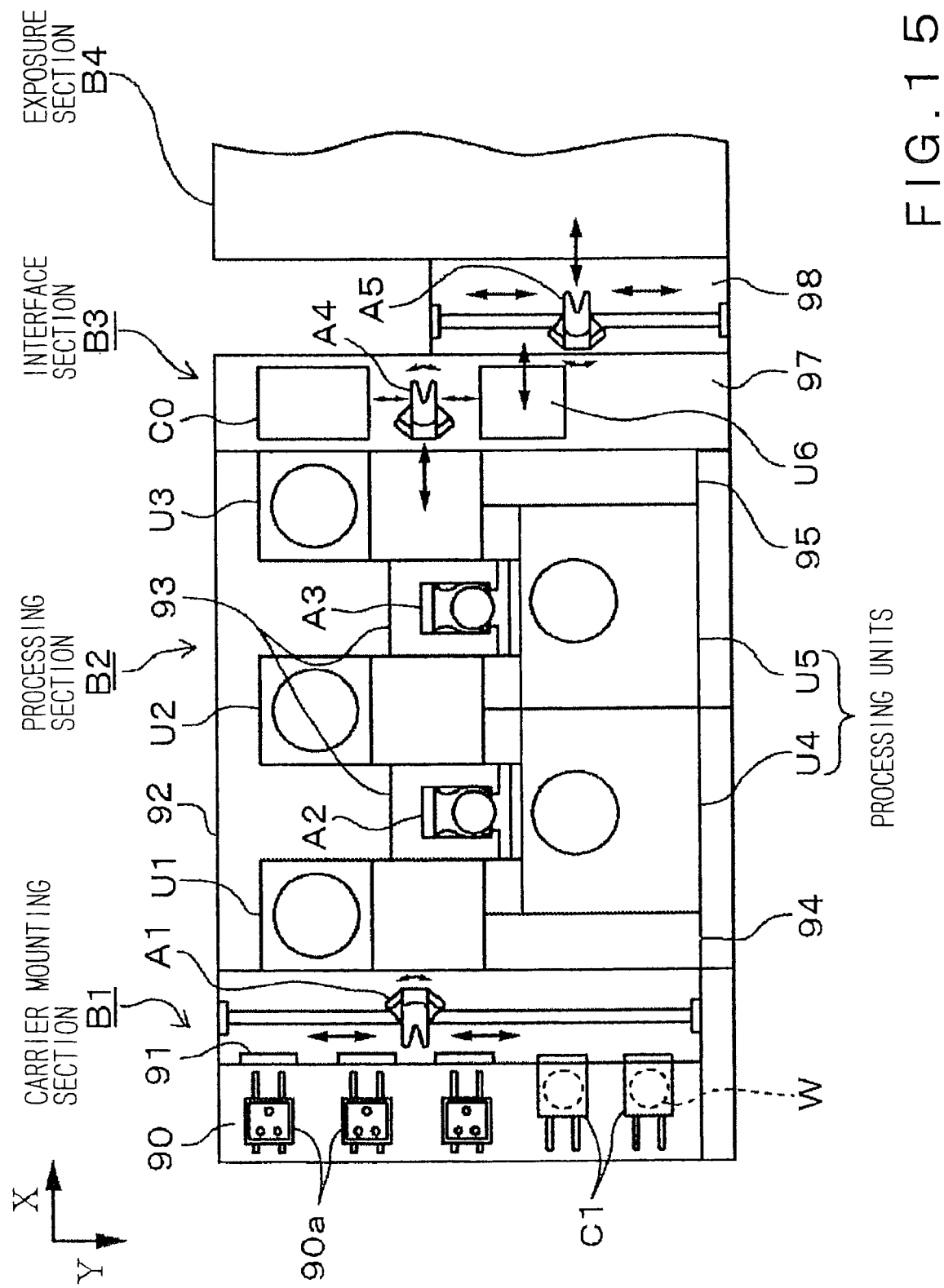
FIG. 15 is a plan view of a coating-and-developing apparatus, in one embodiment, incorporating the developing apparatus.
Figure 16:
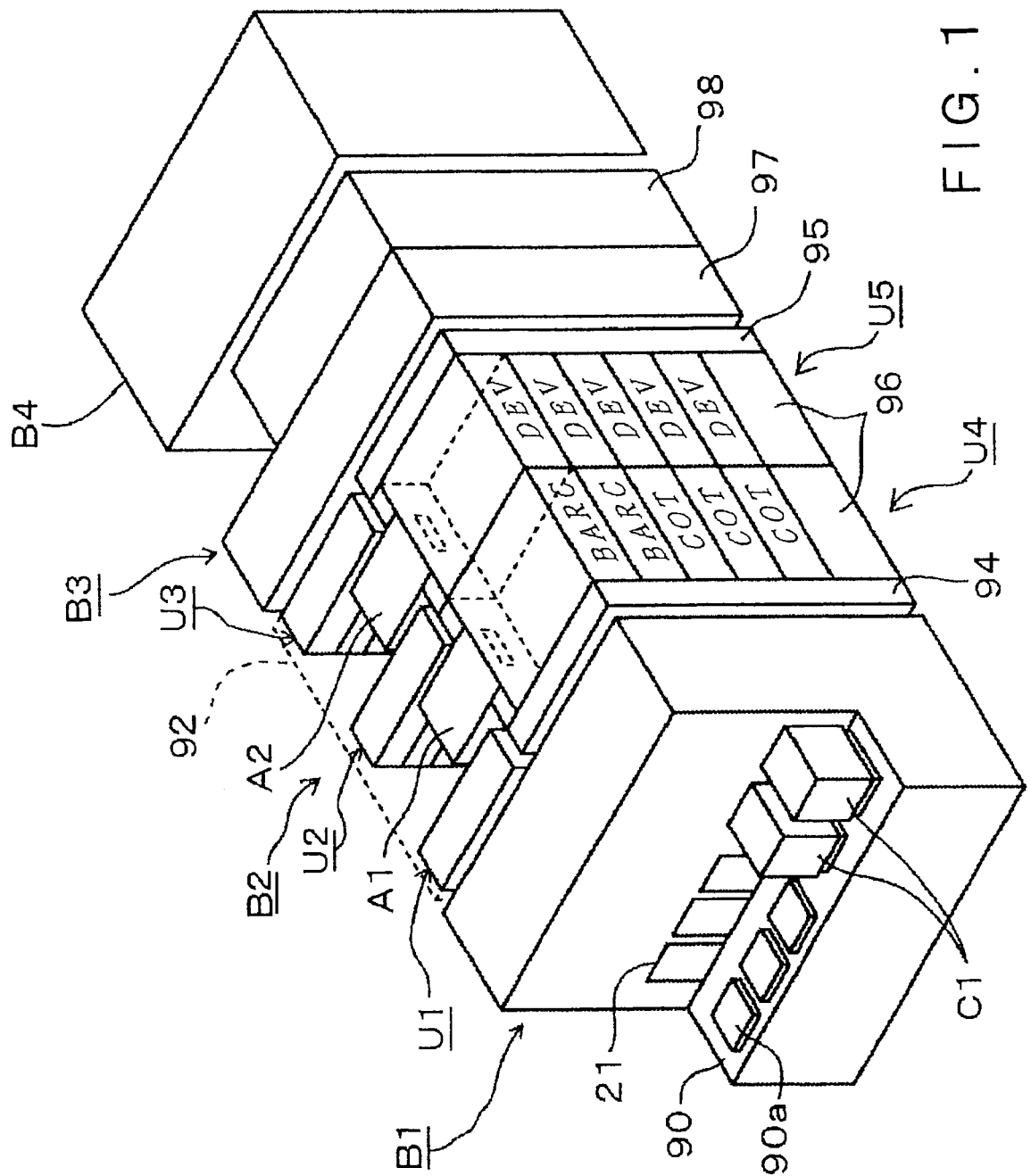
FIG. 16 is a perspective view of the coating-and-developing apparatus incorporating the developing apparatus.
Figure 17:
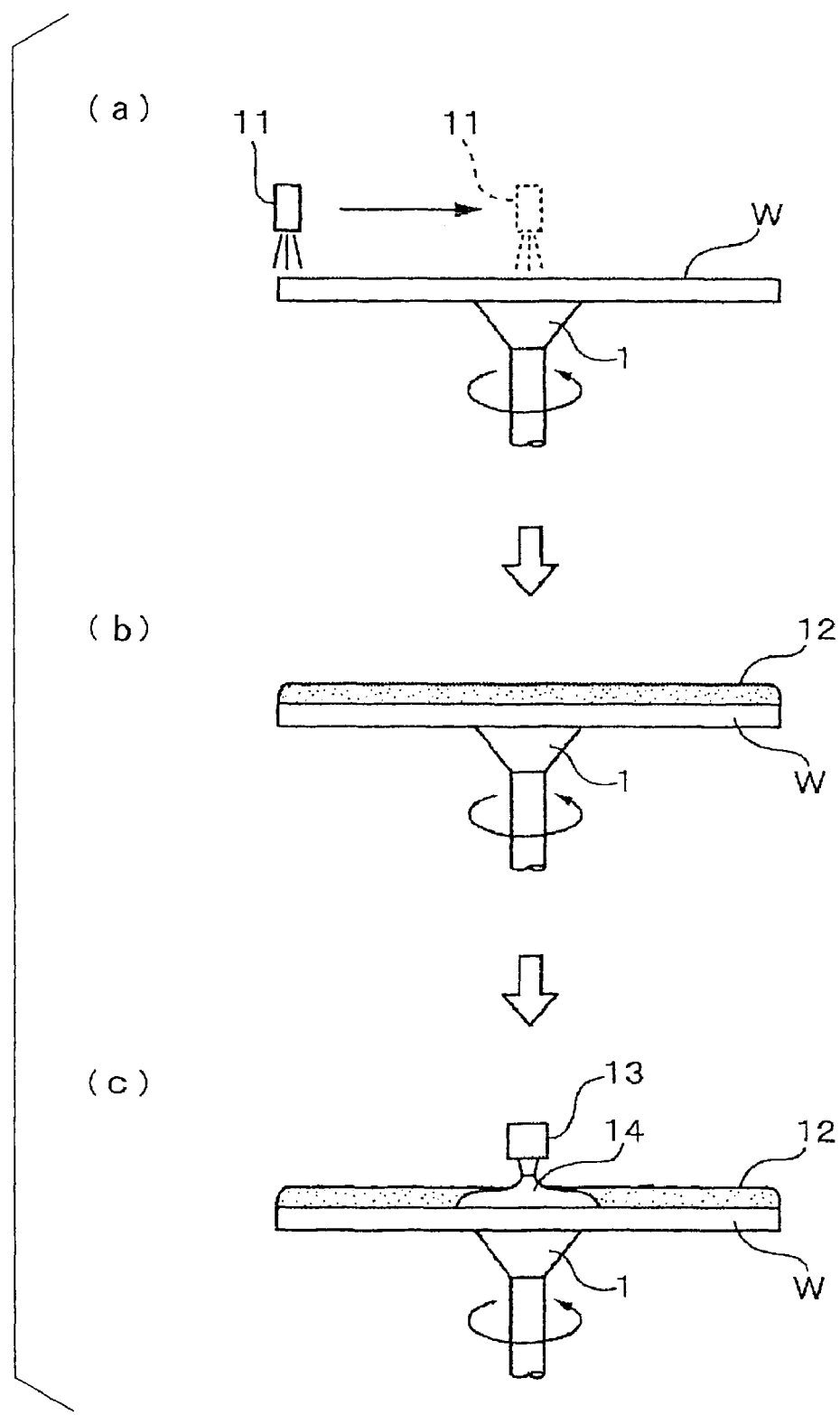
FIG. 17 is a diagram illustrating a conventional developing apparatus.
Figure 18:
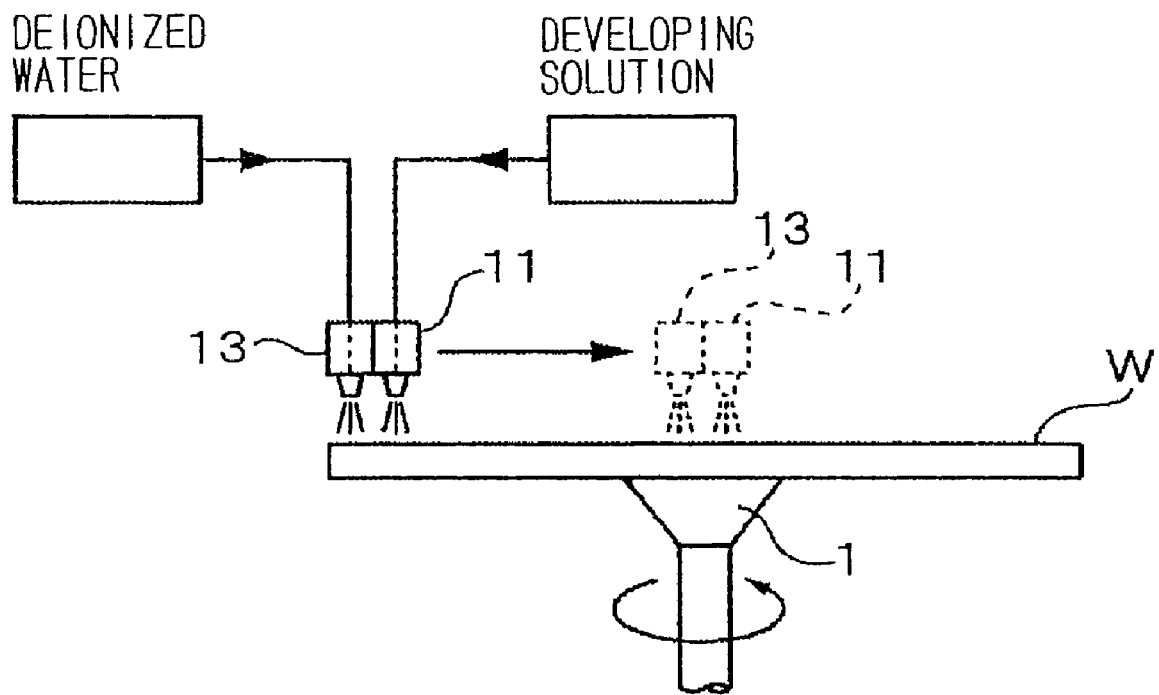
FIG. 18 is a diagram illustrating another conventional developing apparatus.

There will now be described an exemplary configuration of a coating-and-developing apparatus incorporating the above developing apparatus with reference to FIGS. 15 and 16. In these figures, reference numeral B1 denotes a carrier mounting section for transferring carriers C to and from the coating-and-developing apparatus, each carrier C being airtight and containing a plurality of wafers W (for example, 13 wafers W). The carrier mounting section B1 includes: a carrier station 90 having a mount stage 90*a* on which a plurality of carriers C can be mounted; shutters 91 provided in the wall surface in front of the carrier station 90; and a transfer device A1 for removing wafers W from the carriers C through the shutters 91.

A processing section B2 enclosed in an enclosure 92 is connected to the carrier mounting section B1. Unit towers U1, U2, and U3 are disposed within the processing section B2 such that the carrier mounting section B1 and the unit towers U1, U2, and U3 are adjacent each other in that order. Each unit tower is composed of pluralities of heating units and cooling units stacked on one another. Main transfer devices A2 and A3 are provided between adjacent unit towers to transfer wafers W between processing units including coating units and developing units. Each unit tower includes a transfer unit. The wafers W can be transferred from the unit tower U1 to the unit tower U3 within the processing section B1 through these transfer units. The main conveyer A2 and A3 are installed in the spaces defined by sides of unit towers (U1, U2, U3), sides of liquid processing unit towers (U4, U5), and partition walls 93. In the figures, reference numerals 94 and 95 denote temperature/humidity control units each including a temperature control device for controlling the temperature of processing liquids used in each unit, a temperature/humidity control duct, etc.

The liquid processing unit towers U4 and U5 each include a storage unit 96 for storing chemical solutions, such as coating liquids (resist liquids) and developing solutions, and a plurality of other units (for example, 5 other units) stacked on one another over the storage unit 96. These units include: coating units COT; developing apparatuses of the present invention, that is, developing units DEV; and/or antireflective film forming units BARC. The unit towers U1, U2, and U3 each include pluralities of various units (e.g., 10 units) stacked on one another for pre-processing and post-processing for the liquid processing performed by the liquid processing units U4 and U5. These various units include baking units, cooling units, etc.

An exposure section B4 is connected to the far side of the unit tower U3 of the processing section B2 through an interface section B3 that includes a first transfer chamber 97 and a second transfer chamber 98. The interface section B3 further includes: two transfer devices A4 and A5 for transferring wafers W between the processing section B2 and the exposure section B4; a unit tower U6; and a buffer carrier C0.

There will now be described the flow of steps for processing each wafer in this system. First, when a carrier C containing wafers W has been brought into the coating-and-developing apparatus and placed on the mount stage 90, the shutter 91 and the cover of the carrier C are opened and a wafer W is removed from the carrier C by the transfer device A1. Then, the wafer W is transferred to the main transfer device A2 through the transfer unit provided in the unit tower U1, and subjected to a pretreatment process for a coating process in one of the unit towers U1 to U3 (for example, subjected to an antireflective film forming process and a cooling process). After that, the wafer W is coated with a resist liquid in a coating unit COT. Then, after being heated in a baking unit provided in one of the unit towers U1 to U3, the wafer W is cooled and transferred to the interface section B3 through the transfer unit of the unit tower U3. The wafer W is then transferred to the exposure section B4 through the transfer device A4, the unit tower U6, and the transfer device A5 in the interface section B3. Then, after being exposed in the exposure section B3, the wafer W is transferred back to the main transfer device A2 through the same passage in reverse and then developed in the developing unit DEV, thereby formation of a resist mask is completed. After that, the wafer W is returned to the original carrier C on the mounting stage 90.

The invention claimed is:

1. A developing method comprising:
   holding a substrate in a horizontal attitude on a substrate holding unit, the substrate having an exposed resist thereon;
   moving a developer nozzle having an ejection port having a shape of an elongated slit whose length measured in a longitudinal direction thereof is smaller than a radius of the substrate, while a moving direction of the developer nozzle being oriented parallel to the longitudinal direction of the ejection port, and while ejecting a developing solution in a form of a strip from the ejection port, thereby spirally supplying the developing solution onto a surface of the substrate while allowing the developing solution to flow radially outwardly; and
   stopping supplying the developing solution through the developer nozzle and supplying a rinse liquid to the surface of the substrate through a rinse liquid nozzle.

2. The developing method according to claim 1, wherein the ejection port of the developer nozzle has a width in a range of 0.1 mm to 1 mm and a length in a range of 8 mm to 15 mm.

3. The developing method according to claim 1, wherein the temperature of the developing solution is controlled according to a type of the resist, to be developed, on the substrate or a specific geometrical characteristic of a pattern of the resist.

4. The developing method according to claim 1, further comprising:
   selecting one of a plurality of developer nozzles, which have been set to eject developing solutions at different temperatures, based on a type of the resist to be developed on the substrate or a specific geometrical characteristic of a pattern of the resist.

5. The developing method according to claim 4, further comprising:
   while one developer nozzle is selected, adjusting the temperature of a developing solution for another developer nozzle.

6. The developing method according to claim 1, wherein the temperature and concentration of the developing solution are controlled according to a type of the resist, to be developed, on the substrate or a specific geometrical characteristic of a pattern of the resist.

7. The developing method according to claim 6, further comprising:
   while one developer nozzle is selected, adjusting the temperature and concentration of a developing solution for another developer nozzle.

8. The developing method according to claim 1, further comprising:
   moving the rinse liquid nozzle to a position near the developer nozzle before the developer nozzle stops ejecting the developing solution.

9. The developing method according to claim 1, wherein the developing solution supplying includes moving the developer nozzle from the periphery of the substrate toward the center portion of the substrate a plurality of times while ejecting a developing solution through the developer nozzle.

10. The developing method according to claim 1, wherein the developing solution supplying includes supplying the developing solution to the center portion for a predetermined period of time, after moving the developing solution nozzle from the periphery of the substrate toward the center portion of the substrate.

11. The developing method according to claim 1, further comprising:
    supplying a surface treatment liquid to the surface of the substrate to enhance wettability of the surface of the substrate, before supplying the developing solution.

12. The developing method according to claim 1, further comprising:
    supplying a rinse liquid to the surface of the substrate after supplying the developing solution; and
    supplying a surfactant to the surface of the substrate, after supplying the rinse liquid.

13. The developing method according to claim 1, wherein movement of the developer nozzle from the outer portion of the substrate toward the center portion of the substrate is stopped when an end, on a side of the center portion of the substrate, of the ejection port of the developer nozzle has reached a position corresponding to the rotational axis of the substrate.

* * * * *